(12) United States Patent
Park et al.

(10) Patent No.: US 10,734,451 B2
(45) Date of Patent: Aug. 4, 2020

(54) ELECTROLUMINESCENT DISPLAY DEVICE

(71) Applicant: LG Display Co., Ltd., Seoul (KR)

(72) Inventors: EunJi Park, Paju-si (KR); Sungman Han, Paju-si (KR); Kihyung Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/224,522

(22) Filed: Dec. 18, 2018

(65) Prior Publication Data

US 2019/0206949 A1 Jul. 4, 2019

(30) Foreign Application Priority Data

Dec. 28, 2017 (KR) .......................... 10-2017-0182067

(51) Int. Cl.
*H01L 27/32* (2006.01)

(52) U.S. Cl.
CPC ...... *H01L 27/3216* (2013.01); *H01L 27/3246* (2013.01); *H01L 27/3276* (2013.01)

(58) Field of Classification Search
CPC ............. H01L 27/3216; H01L 27/3246; H01L 27/3276
USPC .......................................................... 257/40
See application file for complete search history.

(56) References Cited

U.S. PATENT DOCUMENTS

| | | | |
|---|---|---|---|
| 2003/0169242 A1 | 9/2003 | Nakanishi | |
| 2006/0186202 A1* | 8/2006 | Donner | G07C 13/00 235/386 |
| 2008/0252203 A1 | 10/2008 | Lee | |
| 2008/0284323 A1* | 11/2008 | Kashiwabara | H01L 51/5203 313/504 |
| 2010/0096988 A1 | 4/2010 | Kitabayashi et al. | |
| 2014/0320385 A1* | 10/2014 | Kwon | G09G 3/3233 345/82 |
| 2015/0179725 A1* | 6/2015 | Kuji | H01L 51/5246 257/40 |
| 2015/0333111 A1* | 11/2015 | Sato | H01L 27/3246 257/40 |
| 2016/0079323 A1 | 3/2016 | Choi et al. | |
| 2016/0099293 A1 | 4/2016 | Jung et al. | |
| 2017/0155093 A1* | 6/2017 | Jo | G06F 1/163 |
| 2017/0256596 A1 | 9/2017 | Hamada et al. | |
| 2017/0345877 A1* | 11/2017 | Hwang | H01L 27/3276 |

FOREIGN PATENT DOCUMENTS

| | | |
|---|---|---|
| EP | 1 367 647 A2 | 12/2003 |
| KR | 10-2016-0046152 A | 4/2016 |
| KR | 10-2016-0083206 A | 7/2016 |
| KR | 10-2016-0129688 A | 11/2016 |
| TW | 587400 B | 5/2004 |
| TW | 201743484 A | 12/2017 |

\* cited by examiner

*Primary Examiner* — Dzung Tran

(74) *Attorney, Agent, or Firm* — Seed IP Law Group LLP

(57) ABSTRACT

Disclosed is an electroluminescent display device comprising a substrate, a circuit device layer including a signal line on the substrate, a bank defining a first emission area and a second emission area on the circuit device layer, and a first emission layer in the first emission area, and a second emission layer in the second emission area, wherein the first emission area is overlapped with the signal line, and a width of the first emission area is the same as or less than a width of the signal line.

18 Claims, 12 Drawing Sheets

ELECTROLUMINESCENT DISPLAY DEVICE

CROSS-REFERENCE TO RELATED APPLICATIONS

This application claims the benefit of the Korean Patent Application No. 10-2017-0182067 filed on Dec. 28, 2017, which is hereby incorporated by reference as if fully set forth herein.

BACKGROUND

Technical Field

The present disclosure relates to an electroluminescent display device, and more particularly, to an electroluminescent display device having an emission layer manufactured by a solution process.

Description of the Related Art

An electroluminescent display device is provided in such way that an emission layer is formed between two electrodes. According as the emission layer emits or radiates light by an electric field between the two electrodes, an image is displayed on the electroluminescent display device.

The emission layer may be formed of an organic material which emits light when exciton is produced by the combination of the electron and the hole, and the exciton falls to a ground state from an excited state. Otherwise, the emission layer may be formed of an inorganic material such as quantum dot.

Hereinafter, an electroluminescent display device according to the related art will be described with reference to the accompanying drawings.

FIG. 1 is a cross sectional view illustrating an electroluminescent display device according to the related art.

As shown in FIG. 1, the related art electroluminescent display device may include a substrate 10, a circuit device layer 20, a first electrode 30, a bank 40, and an emission layer 50.

The circuit device layer 20 is formed on the first substrate 10. Herein, various signal lines, a thin film transistor, and a capacitor are formed in the circuit device layer 20.

The first electrode 30 is formed on the circuit device layer 20. The first electrode 30 is patterned by each pixel, wherein the first electrode 30 functions as an anode of the electroluminescent display device.

The bank 40 is formed in a matrix configuration, to thereby define a plurality of emission areas E.

The emission layer 50 is formed in each of the plurality of emission areas E defined by the bank 40. Especially, the emission layer 50 is formed on the first electrode 30 which is exposed in the emission area E by a solution process using an inkjet apparatus.

Referring to the enlarged portion of FIG. 1, which is marked as an arrow and shown in a dotted circle, the circuit device layer 20 will have step differences at many locations due to the various signal lines and the thin film transistor therein. When the emission area E is located above one or more stepped portions of the circuit device layer 20, the step difference will also be present on an upper surface of the first electrode 30 which is exposed in the emission area E. One example of this step difference is shown in the enlarged portion, but there will likely be many others at various locations and of different step heights throughout the circuit device layer 20.

In those locations where the emission layer 50 is formed on the first electrode 30 with the stepped portion by the solution process, the emission layer 50 does not have a uniform thickness within a single emission area E, thereby causing non-uniformity of light emission in the emission area E.

BRIEF SUMMARY

The present disclosure has been made in view of the above problems, and it is an object of the present disclosure to provide an electroluminescent display device capable of providing a uniform emission layer in an emission area by minimizing a step difference therein, and realizing a uniform light emission in the emission area.

In accordance with an aspect of the present disclosure, the above and other objects can be accomplished by the provision of an electroluminescent display device comprising a substrate, a circuit device layer provided on the substrate and configured to include a signal line, a bank provided on the circuit device layer and configured to define a first emission area and a second emission area, and a first emission layer provided in the first emission area, and a second emission layer provided in the second emission area, wherein the first emission area is overlapped with the signal line, and a width of the first emission area is the same as or less than a width of the signal line.

In accordance with another aspect of the present disclosure, there is provided an electroluminescent display device comprising a substrate, a high power line and a low power line arranged in a first direction on the substrate, a plurality of circuit device columns provided between the high power line and the low power line on the substrate, and configured to include a plurality of thin film transistors for controlling a light emission, a bank provided on the high power line, the low power line, and the plurality of circuit device columns, and configured to define a plurality of emission areas, and an emission layer provided in each of the plurality of emission areas, wherein the plurality of emission areas includes a first emission area which is overlapped with the high power line or the low power line, and is configured to have a width which is the same as or less than a width of the high power line or a width of the low power line.

In accordance with a further aspect of the present disclosure, there is provided an electroluminescent display device comprising a substrate, a circuit device layer provided on the substrate and configured to include a first circuit device column, a second circuit device column, and a third circuit device column, a bank provided on the circuit device layer and configured to define a first emission area, a second emission area, and a third emission area, and a first electrode individually overlapped with the first emission area, the second emission area, and the third emission area, wherein each of the first to third circuit device columns includes a switching thin film transistor and a driving thin film transistor so as to control a light emission, the first electrode overlapped with the first emission area is connected with one terminal of the driving thin film transistor provided in the first circuit device column or the third circuit device column, and the first emission area is not overlapped with the first circuit device column and the third circuit device column.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
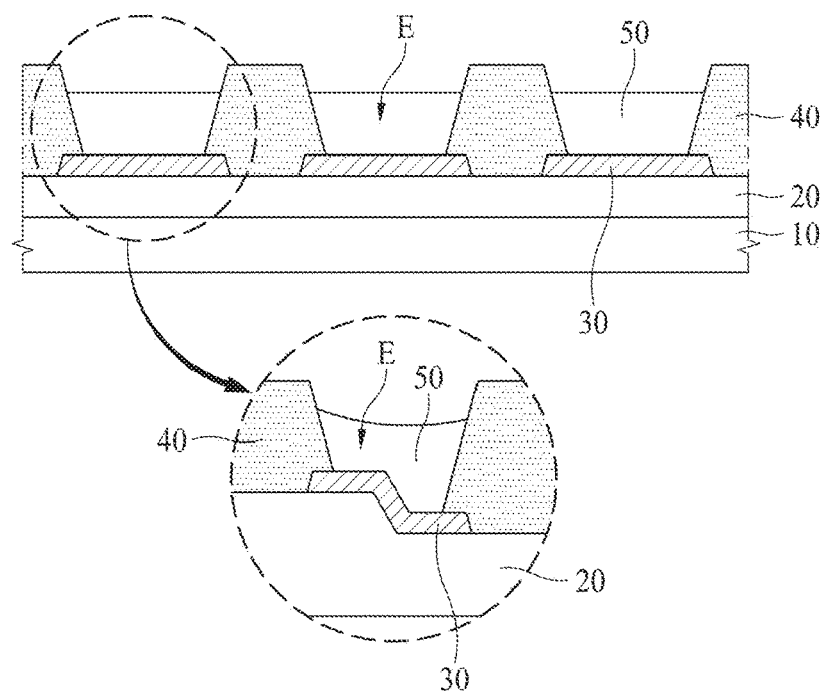
FIG. 1 is a cross sectional view illustrating an electroluminescent display device according to the related art.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is not needed to provide an understanding of the present disclosure, it will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

The term "overlapped" includes layers that overlay each other. The overlap can occur with layer that is either above or below the particular layer referenced. The overlapped layer can be a full overlap in which the entire width of one layer fully overlaps the entire width of another layer and thus has the same or greater width. Or, it can be a partial overlap in which some parts of the layer directly overlay (or are overlaid by) the over layer and some part of the layer does not overlay (or is overlaid by) the other layer. In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an electroluminescent display device according to the embodiment of the present disclosure will be described in detail with reference to the accompanying drawings.

Figure 2:
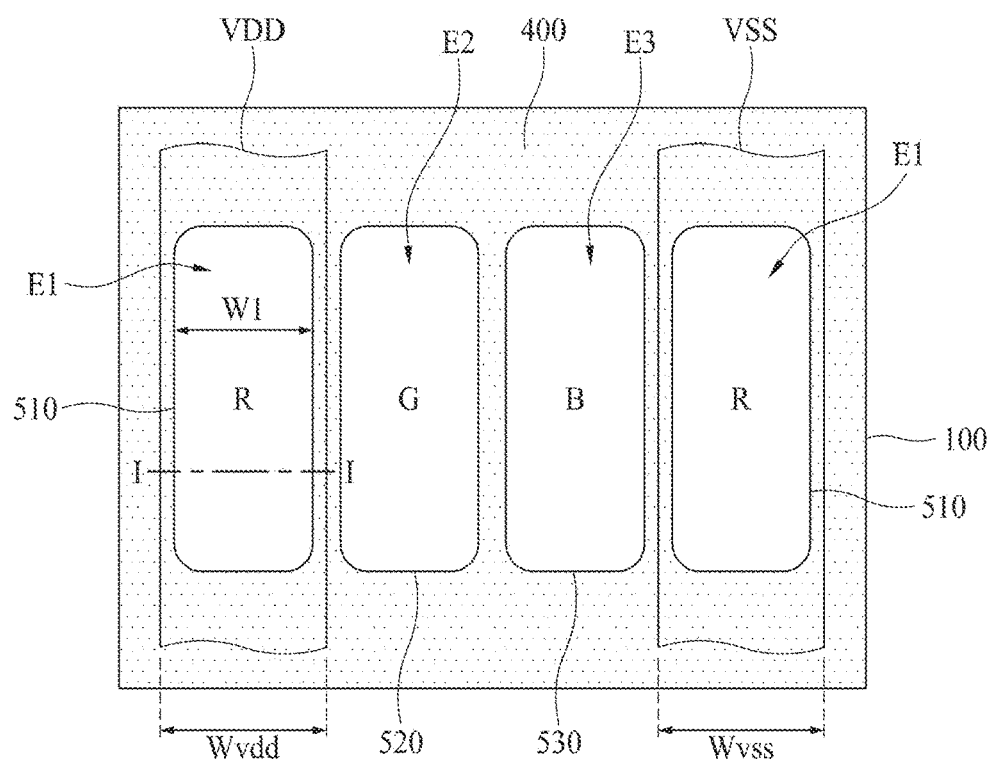
FIG. 2 is a plan view illustrating an electroluminescent display device according to one embodiment of the present disclosure.

FIG. 2 is a plan view illustrating an electroluminescent display device according to one embodiment of the present disclosure.

As shown in FIG. 2 the electroluminescent display device according to one embodiment of the present disclosure may include a substrate 100, a high level power line VDD, a low level power line VSS, a bank 400, and an emission layer 510, 520 and 530.

The substrate 100 may be formed of a glass or plastic material, but not limited to this material. The substrate 100 may be formed of a transparent material or opaque material. When the electroluminescent display device according to one embodiment of the present disclosure is formed in a top emission type where emitted light radiates toward an upper side, the substrate 100 may be formed of the opaque material as well as the transparent material.

The high level power line VDD is formed in a first direction on the substrate 100, for example, a vertical direction on the substrate 100. The high level power line VDD may supply the high level electric power to a terminal of a driving thin film transistor for driving an organic light emitting device.

The low level power line VSS is formed in the first direction on the substrate 100. That is, the low level power line VSS is parallel to the high level power line VDD. The low level power line VSS supplies the low level electric power to a cathode of the organic light emitting device.

The organic light emitting device may include the emission layers 510, 520 and 530. Further, the organic light emitting device may include the anode and the cathode respectively provided above and below the emission layers 510, 520 and 530. In this case, the anode is connected with a source terminal of the driving thin film transistor, and the cathode is connected with the low level power line VSS. Also, a drain terminal of the driving thin film transistor may be connected with the high level power line VDD. The low level power line VSS corresponds to the line for supplying the relatively low level electric power, and the high level power line VDD corresponds to the line for supplying the relatively high level electric power.

In addition to the high level power line VDD and the low level power line VSS, signal lines such as a gate line, a data line, a reference line, and a sensing control line may be additionally provided on the substrate 100. A detailed structure of the signal lines such as the high level power line VDD, the low level power line VSS, the gate line, the data line, the reference line, and the sensing control line will be readily understood with reference to the embodiment of FIG. 5.

The bank 400 is formed in a matrix configuration on the substrate 100, to thereby define a plurality of emission areas E1, E2 and E3. That is, an opening portion in which the bank 400 is not formed becomes the emission area. The emission area may include first, second, and third emission areas E1, E2 and E3. The respective emission areas E1, E2 and E3 may emit the different-colored light.

The first emission area E1 is overlapped with the high level power line VDD or the low level power line VSS. Especially, entire portions of the first emission area E1 are overlapped with the high level power line VDD or the low level power line VSS. Thus, a width W1 of the first emission area E1 may be smaller than or identical to a width Wvdd of the high level power line VDD and a width Wvss of the low level power line VSS. In this present disclosure, the widths W1, W2 and W3 of the emission areas E1, E2 and E3 indicates the widths in a length direction and a perpendicular direction of the high level power line VDD or the low level power line VSS.

The high level power line VDD and the low level power line VSS may be periodically formed by each cycle corresponding to a plurality of pixels instead of being formed by each individual pixel. When the high level power line VDD and the low level power line VSS are periodically formed by each cycle of the plurality of pixels, each of the width Wvdd of the high level power line VDD and the width Wvss of the low level power line VSS is larger than a width of the data line formed by each individual pixel, preferably.

Thus, according to one embodiment of the present disclosure, the high level power line VDD and the low level power line VSS are periodically formed by each cycle corresponding to the plurality of pixels, each of the width Wvdd of the high level power line VDD and the width Wvss of the low level power line VSS is identical to or larger than the width W1 of the first emission area E1. The first emission area E1 is overlapped with the high level power line VDD and the low level power line VSS so that it is possible to prevent step differences from being generated in the first emission area E1 by the high level power line VDD and the low level power line VSS. Accordingly, when the first emission layer 510 is formed in the first emission area E1 by a solution process, the first emission layer 510 may have a uniform profile in the first emission area E1, to thereby realize a uniform light emission in the first emission area E1.

As shown in the drawings, the first emission area E1 is overlapped with each of the high level power line VDD and the low level power line VSS, while the second emission area E2 and the third emission area E3 are not overlapped with the high level power line VDD and the low level power line VSS, but not limited to this structure. At least one of the first emission area E1, the second emission area E2 and the third emission area E3 may be overlapped with at least one of the high level power line VDD and the low level power line VSS.

The emission layers 510, 520 and 530 are formed in the emission areas E1, E2 and E3 defined by the bank 400, respectively. The emission layers 510, 520 and 530 may include the first emission layer 510 provided in the first emission area E1, the second emission layer 520 provided in the second emission area E2, and the third emission layer 530 provided in the third emission area E3. The first emission layer 510 is formed of a red (R) emitting layer, the second emission layer 520 is formed of a green (G) emitting layer, and the third emission layer 530 is formed of a blue (B) emitting layer. That is, the respective emission layers 510, 520 and 530 may be formed of the emitting layers for radiating the different colored light.

Generally, an efficiency of the blue (B) emitting layer is lower than an efficiency of the red (R) emitting layer and an efficiency of the green (G) emitting layer, whereby an area of the blue (B) emitting layer may be relatively larger than an area of the red (R) emitting layer and an area of the green (G) emitting layer. Also, the efficiency of the green (G) emitting layer may be lower than the efficiency of the red (R) emitting layer. In this case, the area of the green (G) emitting layer may be larger than the area of the red (R) emitting layer. Eventually, the area of the red (R) emitting layer may be smaller than the area of the blue (B) emitting layer and the area of the green (G) emitting layer.

When the width Wvdd of the high level power line VDD and the width Wvss of the low level power line VSS are too large, a width of another signal line has to be decreased in consideration of a preset size of the substrate 100. However, this is not preferable in an aspect of a stable signal power supply and a manufacturing process for forming another signal line. Accordingly, it is difficult to decrease the width Wvdd of the high level power line VDD and the width Wvss of the low level power line VSS beyond a certain amount for proper circuit operation.

In case of one embodiment of the present disclosure, the first emission layer 510 having the red (R) emitting layer having the smallest area may be overlapped with the high level power line VDD and the low level power line VSS so that the width Wvdd of the high level power line VDD and the width Wvss of the low level power line VSS are formed to be less than a predetermined level for preventing any problem for the process of forming another signal line. However, the area of the green (G) emitting layer may be identical to the area of the red (R) emitting layer. In this case, the second emitting layer 520 having the green (G) emitting layer may be overlapped with the high level power line VDD and the low level power line VSS. Also, in some cases, the red (R) emitting layer, the green (G) emitting layer, and the blue (B) emitting layer may have the same-sized area. In that case, the third emitting layer 530 having the blue (B) emitting layer may be overlapped with the high level power line VDD and the low level power line VSS.

Figure 3:
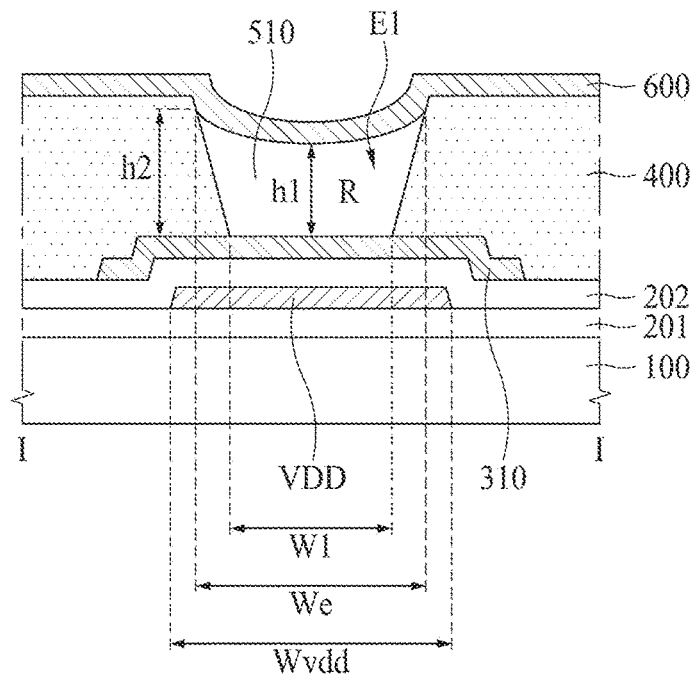
FIG. 3 is a cross sectional view illustrating an electroluminescent display device according to one embodiment of the present disclosure, which corresponds to a cross sectional view along I-I of FIG. 2.

FIG. 3 is a cross sectional view illustrating an electroluminescent display device according to one embodiment of the present disclosure, which corresponds to a cross section along I-I of FIG. 2.

As shown in FIG. 3, a high level power line VDD is patterned on a substrate 100. Then, a lower insulating layer 201 is formed below the high level power line VDD, and an upper insulating layer 202 is formed above the high level power line VDD. The lower insulating layer 201 may be formed of at least one among a buffer layer, a gate insulating layer, and an insulating interlayer, and the upper insulating layer 202 may be formed of at least one of a passivation layer and a planarization layer.

Then, a first electrode 310 is formed on the upper insulating layer 202. An area of the first electrode 310 is larger than a first emission area E1. The first electrode 310 may function as an anode of the electroluminescent display device. When the electroluminescent display device according to one embodiment of the present disclosure is formed in a top emission type, the first electrode 310 may include a reflective material for upwardly reflecting light emitted from the first emission layer 510. In this case, the first electrode 310 may be formed in a stacked structure of a transparent conductive material and the reflective material.

A bank 400 is formed on the first electrode 310. The bank 400 covers both ends of the first electrode 310, and defines the first emission area E1. An exposed portion of the first electrode 310, which is exposed without being covered by the bank 400, corresponds to the first emission area E1.

The bank 400 may be formed of an organic insulating material having the hydrophilic property. In this case, the emission layer 510 smoothly spreads to a lateral surface of the bank 400 so that the first emission layer 510 is uniformly formed in the first emission area E1. Meanwhile, when the entire area of the bank 400 has the hydrophilic property, the first emission layer 510 formed in the first emission area E1 overflows into the neighboring emission area E2 or E3 over an upper surface of the bank 400, whereby the first emission layer 510 formed in the first emission area E1 may be mixed together with the emission layer 520 or 530 formed in the neighboring emission area E2 or E3. Thus, the upper surface of the bank 400 has the hydrophobic property so as to prevent the mixture of the neighboring emission layers 510, 520 and 530, preferably. To this end, the bank 400 may be obtained by coating a mixture solution of an organic insulating material having the hydrophilic property and a hydrophobic material such as fluorine, and patterning the coated mixture solution by the use of photolithography process. By the light irradiated for the photolithography process, the hydrophobic material such as fluorine may move to an upper portion of the bank 400, whereby the upper portion of the bank 400 may have the hydrophobic property, and the remaining portions of the bank 400 may have the hydrophilic property. In this case, the upper surface of the bank 400 has the hydrophobic property so that it is possible to decrease the spread of the neighboring emission layers 510, 520 and 530 into the upper surface of the bank 400 to some degree, thereby reducing a problem related with the mixture of the neighboring emission layers 510, 520 and 530.

The first emission layer 510 having the red (R) emitting layer is formed in the first emission area E1 defined by the bank 400. The first emission layer 510 is formed on the exposed portion of the first electrode 310. The first emission layer 510 may include at least one organic layer among a hole injecting layer (HIL), a hole transporting layer (HTL), an emitting material layer (EML), and an electron transporting layer (ETL). The other emission layers 520 and 530 may have the same structure as described above.

The first emission layer 510 is formed in the first emission area E1 by an inkjet process without using a mask. In this case, a height h1 of an upper surface of the first emission layer 510 at the center portion of the first emission area E1 after a drying process of the solution for forming the first emission layer 510 is lower than a height h2 of an upper surface of the first emission layer 510 at the side portion of the first emission area E1, and more particularly, at the side portion of the first emission area E1 being in contact with the bank 400. Especially, as shown in the drawings, according as the height of the first emission layer 510 is gradually lowered from the side portion of the first emission area E1 being in contact with the bank 400 to the center portion of the first emission area E1, it is possible to realize a gradually-lowered profile shape. Accordingly, a portion of a second electrode 600 formed on the first emission layer 510 may have the same profile corresponding to the profile of the first emission layer 510.

The second electrode 600 is formed on the first emission layer 510. The second electrode 600 may function as a cathode of the electroluminescent display device. According as the second electrode 600 is formed on the bank 400 as well as the first emission layer 510, the second electrode 600 is formed over the plurality of pixels, and also formed over the boundary areas between each of the plurality of pixels. Thus, the second electrode 600 may function as a common electrode for applying a common voltage to the plurality of pixels.

When the electroluminescent display device according to one embodiment of the present disclosure is formed in a top emission type, the second electrode 600 may be formed of a transparent conductive material for upwardly advancing light emitted from the first emission layer 510, or may be formed with a small thickness so as to improve transmittance.

Although not shown in detail, an encapsulation layer may be additionally formed on the second electrode 600. The encapsulation layer prevents external moisture from being permeated into the first emission layer 510. The encapsulation layer may be formed of an inorganic insulating material, or may be formed in a deposition structure obtained by alternately depositing an inorganic insulating material and an organic insulating material, but not limited to these structures.

According to one embodiment of the present disclosure, there may be the step difference between the area having the high level power line VDD and the remaining area in which the high level power line VDD is not formed, whereby the step different may be reappeared at the upper insulating layer 202 covering the high level power line VDD. When the upper insulating layer 202 includes a planarization layer having a relatively large thickness, it is possible to obscure the step difference to some degrees. However, the step difference is not completely removed or obscured. Thus, the step difference may be also reappeared in the first electrode 310 formed on the upper insulating layer 202.

However, the width W1 of the first emission area E1 is formed to be identical to or less than the width Wvdd of the high level power line VDD, and the entire portions of the first emission area E1 are overlapped with the high level power line VDD. Thus, the step difference reappeared at the surface of the first electrode 310 caused by the high level power line VDD is not exposed in the first emission area E1. As a result, when the first emission layer 510 is formed in the first emission area E1 by the solution process, the first emission layer 510 may have a uniform profile in the first emission area E1, to thereby realize a uniform light emission in the first emission area E1.

In this case, the width We of the first emission layer 510 may be formed to be identical to or less than the width Wvdd of the high level power line VDD, but is not limited to this structure. When the first emission layer 510 flows over the upper surface of the bank 400, the width We of the first emission layer 510 may be formed to be larger than the width Wvdd of the high level power line VDD.

In some embodiments, the width We of the first emission layer will be about that same as the width W1 of the first emission area. If the bank 400 has vertical, or nearly vertical sidewalls for the opening of the emission area, then the width W1 at the bottom, where the emission area is measured will be about the same at the width We at the top of the bank where the width of the emission layer is measured. In other embodiments, the walls of the bank may be sloped, in some instances with a large slope resulting in the width at the top, We, being somewhat larger than the width at the bottom, W1. In some embodiments, the slope might be sufficiently large that the width We at the top is wider than the respective signal line width, in the example shown, Vdd which has a width Wvdd.

Figure 4:
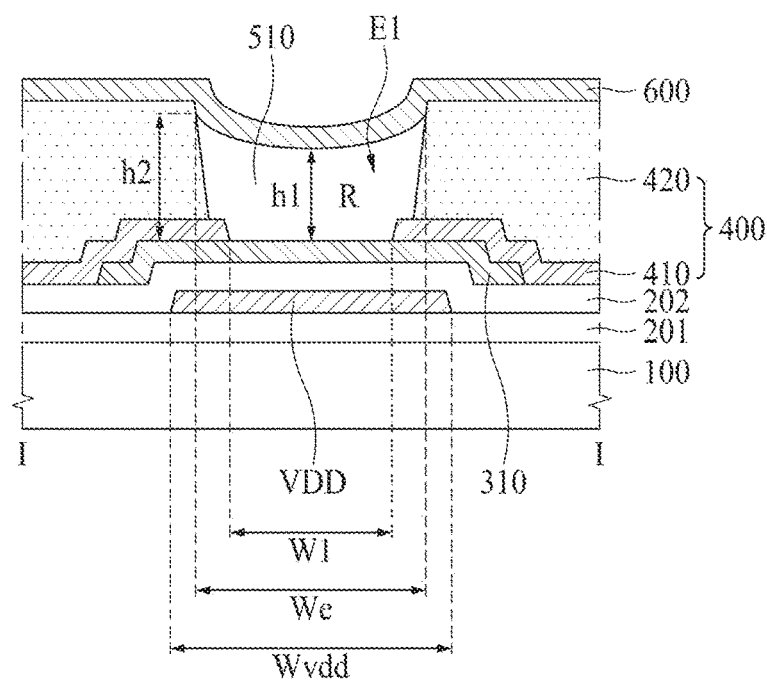
FIG. 4 is a cross sectional view illustrating an electroluminescent display device according to another embodiment of the present disclosure, which corresponds to a cross sectional view along I-I of FIG. 2.

FIG. 4 is a cross sectional view illustrating an electroluminescent display device according to another embodiment of the present invention, which corresponds to a cross section along I-I of FIG. 2. Since a structure of a bank 400, the electroluminescent display device of FIG. 4 is identical in structure to the electroluminescent display device of FIG. 3, whereby the same reference numbers will be used throughout the drawings to refer to the same parts. Hereinafter, only the different structures will be described in detail as follows.

Referring to FIG. 4, a bank 400 includes a first bank 410 and a second bank 420.

The first bank 410 covers an end of a first electrode 310, and the first bank 410 is formed on an upper insulating layer 202. A thickness of the first bank 410 is relatively smaller (or thinner) than a thickness of the second bank 420, and a width of the first bank 410 is relatively larger (or wider) than a width of the second bank 420. With the above structure, the first bank 410 has the hydrophilic property same as the first emission layer 510. The first bank 410 having the hydrophilic property may be formed of an inorganic insulating material such as silicon oxide. Thus, when the first emission layer 510 is formed by a solution process, a solution for forming the first emission layer 510 may spread easily on the first bank 410.

The second bank 420 is formed on the first bank 410. The width of the second bank 420 is relatively larger than the width of the first bank 410. The second bank 420 may be obtained by coating a mixture solution of an organic insulating material having the hydrophilic property and a hydrophobic material such as fluorine, and patterning the coated mixture solution by the use of photolithography process. By the light irradiated for the photolithography process, the hydrophobic material such as fluorine may move to an upper portion of the second bank 420, whereby the upper portion of the second bank 420 has the hydrophobic property, and the remaining portions of the second bank 420 have the hydrophilic property. That is, the lower portion of the second bank 420 which is in contact with the first bank 410 has the hydrophilic property, and the upper portion of the second bank 420 has the hydrophobic property. However, it is not limited to this structure. For example, the entire portions of the second bank 420 may have the hydrophobic property.

Herein, spreadability of the solution for forming the first emission layer 510 may be improved owing to the first bank 410 having the hydrophilic property and the lower portion of the second bank 420 having the hydrophilic property. Especially, as the first bank 410 has the relatively smaller thickness and the relatively larger width in comparison to the second bank 420, it is possible to prepare a 2-step structure of the hydrophilic property by the combination of the first bank 410 and second bank 420, whereby the solution for forming the first emission layer 510 may easily spread to the circumference sides of the first emission area E1.

Also, the upper portion of the second bank 420 having the hydrophobic property prevents the solution for forming the first emission layer 510 from spreading or overflowing to another neighboring emission area E2 or E3 so that it is possible to prevent the first emission layer 510 from being mixed with the emission layer 520 or 530 of another neighboring emission area E2 or E3.

Figure 5:
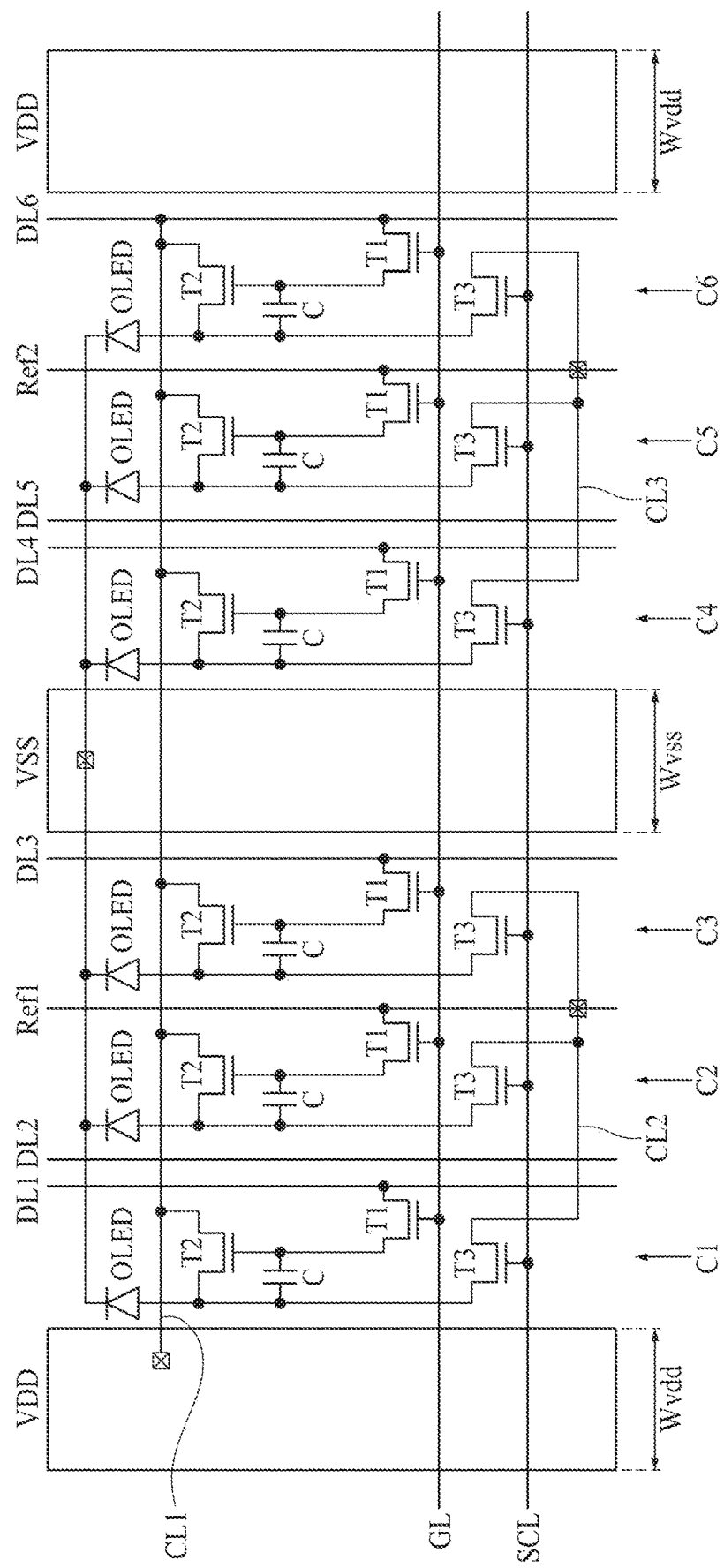
FIG. 5 is a circuit diagram illustrating an electroluminescent display device according to one embodiment of the present disclosure.
Figure 6:
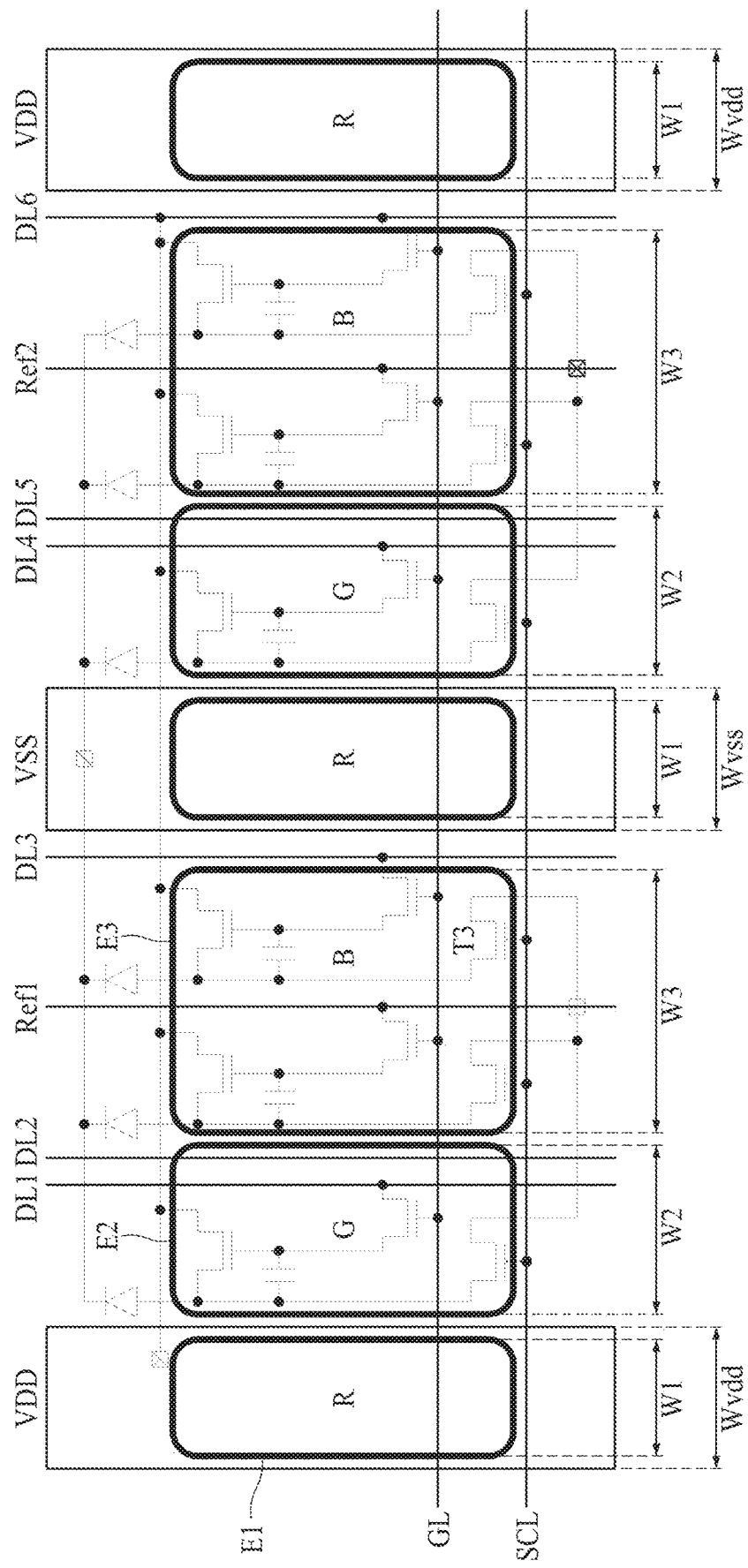
FIG. 6 is a plan view illustrating an electroluminescent display device according to one embodiment of the present disclosure, which shows a plurality of emission areas arranged in a circuit structure of FIG. 5.
Figure 7:
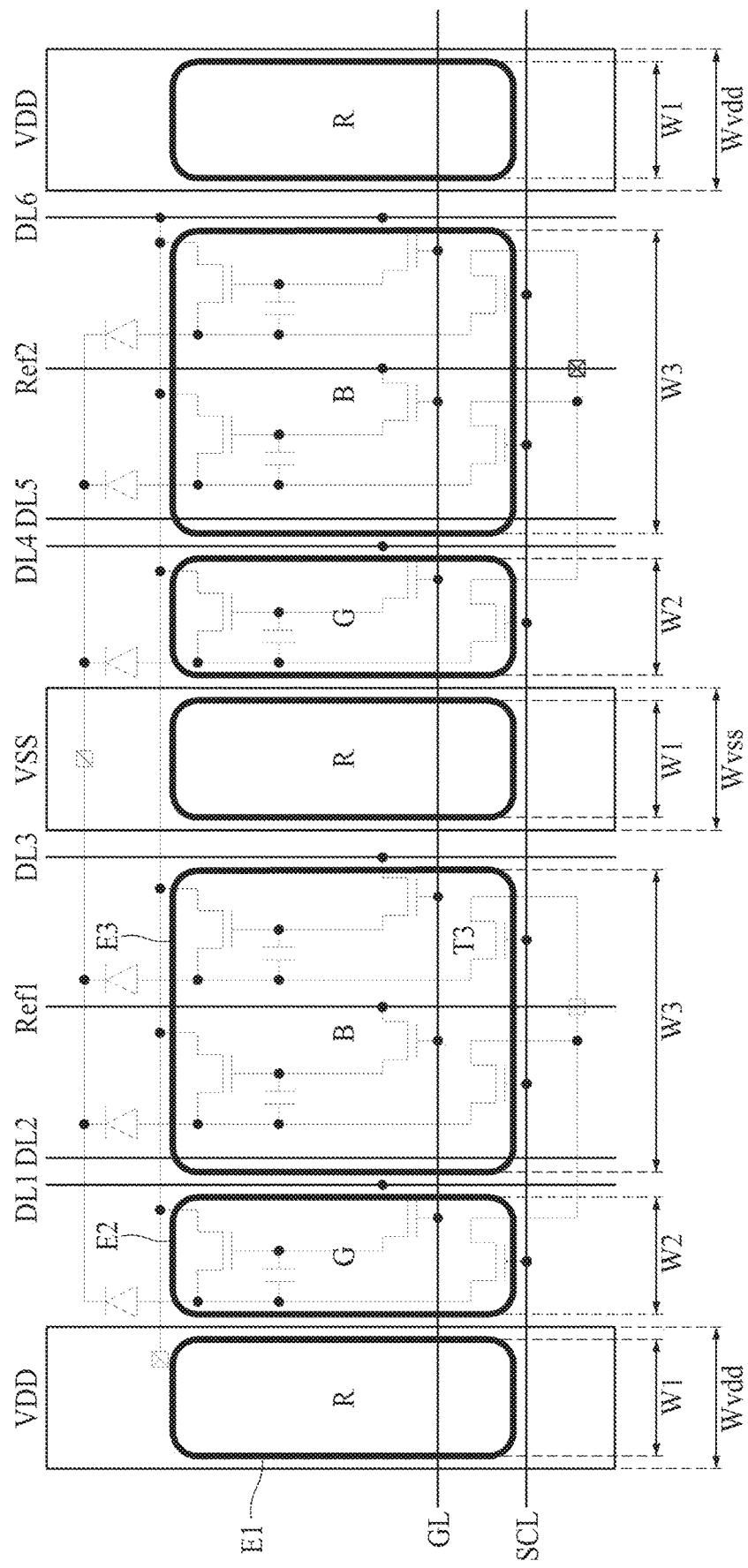
FIG. 7 is a plan view illustrating an electroluminescent display device according to another embodiment of the present disclosure, which shows a plurality of emission areas arranged in a circuit structure of FIG. 5.

FIG. 5 is a circuit diagram illustrating an electroluminescent display device according to one embodiment of the present disclosure. FIGS. 6 and 7 are plan views illustrating electroluminescent display devices according to various embodiments of the present disclosure, which shows a plurality of emission areas arranged in a circuit structure of FIG. 5.

As shown in FIG. 5, the electroluminescent display device according to one embodiment of the present disclosure includes a gate line GL, a sensing control line SCL, a high level power line VDD, a low level power line VSS, data lines DL1, DL2, DL3, DL4, DL5 and DL6, reference lines Ref1 and Ref2, a switching thin film transistor T1, a driving thin film transistor T2, a sensing thin film transistor T3, a capacitor C, and an organic light emitting diode OLED.

The gate line GL is arranged in a horizontal direction. The gate line GL supplies a gate signal to a gate electrode of the switching thin film transistor T1 provided in each circuit device column C1, C2, C3, C4, C5 and C6.

The sensing control line SCL is provided at a predetermined interval from the gate line GL, and is arranged in the horizontal direction while being parallel to the gate line GL. The sensing control line SCL supplies a sensing control signal to a gate electrode of the sensing thin film transistor T3 provided in each circuit device column C1, C2, C3, C4, C5 and C6.

The high level power line VDD is arranged in a vertical direction while being perpendicular to the gate line GL and the sensing control line SCL. The high level power line VDD supplies the high level electric power to a drain electrode of the driving thin film transistor T2 provided in each circuit device column C1, C2, C3, C4, C5 and C6.

According to one embodiment of the present disclosure, one high level power line VDD is configured to supply the high level electric power to a drain electrode of the driving thin film transistor T2 provided in each of the six circuit device columns C1, C2, C3, C4, C5 and C6 at the same time. Thus, a first connection line CL1 is provided to connect one high level power line VDD with the drain electrode of each driving thin film transistor T2. The first connection line CL1 extends in a horizontal direction from one high level power line VDD to the sixth circuit device column C6 passing the first to third circuit device columns C1, C2 and C3, the low level power line VSS, and the fourth and fifth circuit device columns C4 and C5 in sequence. The first connection line CL1 is connected to the high level power line VDD, and is also connected to the drain electrodes of the driving thin film transistors T2 provided in each circuit device column C1, C2, C3, C4, C5 and C6.

The low level power line VSS is arranged in a vertical direction while being parallel to the high level power line VDD. The low level power line VSS supplies the low level electric power to a cathode of the organic light emitting device OLED. As the cathode is formed on an entire surface of a substrate, there is no need for a connection line such as the aforementioned first connection line CL1 so as to connect the low level power line VSS with the cathode of the individual organic light emitting device OLED. In detail, the cathode formed on the entire surface of the substrate is connected with the low level power line VSS via a predetermined contact hole. Thus, the line extending from the individual organic light emitting device OLED to the low power line VSS, which is shown in the drawings, is provided only to show the electrical connection between the cathode of the organic light emitting device OLED the low level power line VSS. Virtually, there is no need for the line extending from the individual organic light emitting device OLED to the low level power line VSS.

A width of the high level power line VDD and a width of the low level power line VSS are larger than a width of the data lines DL1, DL2, DL3, DL4, DL5 and DL6 and a width of the reference lines Ref1 and Ref2.

The data lines DL1, DL2, DL3, DL4, DL5 and DL6 are arranged in the vertical direction. The data lines DL1, DL2, DL3, DL4, DL5 and DL6 are formed between the high level power line VDD and the low level power line VSS.

The data lines DL1, DL2, DL3, DL4, DL5 and DL6 may include the first data line DL1, the second data line DL2, the third data line DL3, the fourth data line DL4, the fifth data line DL5, and the sixth data line DL6.

The first data line DL1 faces with the high level power line VDD at the left side thereof, and also faces with the second data line DL2 at the right side thereof. In this case, the first data line DL1 and the high level power line VDD are provided at a predetermined interval from each other. However, the first data line DL1 and the second data line DL2 are positioned adjacent to each other. In detail, the first circuit device column C1 having circuit devices such as the switching thin film transistor T1, the driving thin film transistor T2, the sensing thin film transistor T3, and the capacitor is formed between the first data line DL1 and the high level power line VDD. However, any of the circuit device column having the above circuit device is not formed between the first data line DL1 and the second data line DL2. In this present disclosure, when any one line is provided adjacent to another line, it may indicate that the circuit device is not formed between these two adjacent lines.

The second data line DL2 is provided adjacent to the first data line DL1 at the left side thereof. Further, the second data line DL2 is provided at a predetermined interval from the first reference line Ref1 at the right side thereof under the circumstances that the second circuit device column C2 is positioned there-between. The third data line DL3 is provided at a predetermined interval from the first reference line Ref1 at the left side thereof under the circumstances that the third circuit device column C3 is positioned there-between. In addition, the third data line DL3 is provided adjacent to the low level power line VSS at the right side thereof. The fourth data line DL4 is provided at a predetermined interval from the low level power line VSS at the left side thereof under the circumstances that the fourth circuit device column C4 is positioned there-between. The fourth data line DL4 is provided adjacent to the fifth data line DL5 at the right side thereof. The fifth data line DL5 is provided adjacent to the fourth data line DL4 at the left side thereof, and is provided at a predetermined interval from the second reference line Ref2 under the circumstances that the fifth circuit device column C5 is positioned there-between. The sixth data line DL6 is provided at a predetermined interval from the second reference line Ref2 at the left side thereof under the circumstances that the sixth circuit device column C6 is positioned there-between. The sixth data line DL6 is provided at a predetermined interval from another high power line VDD in the right side thereof.

The data lines DL1, DL2, DL3, DL4, DL5 and DL6 supply a data voltage to the source electrodes of the switching thin film transistors T1 provided in each circuit device columns C1, C2, C3, C4, C5 and C6.

The reference lines Ref1 and Ref2 are arranged in the vertical direction between the high level power line VDD and the low level power line VSS. The reference lines Ref1 and Ref2 may include the first reference line Ref1 and the second reference line Ref2.

The first reference line Ref1 is provided at a predetermined interval from the second data line DL2 at the left side thereof under the circumstances that the second circuit device column C2 is positioned there-between. The first reference line Ref1 is provided at a predetermined interval from the third data line DL3 at the right side thereof under the circumstances that the third circuit device column C3 is positioned there-between.

The second reference line Ref2 is provided at a predetermined interval from the fifth data line DL5 at the left side thereof under the circumstances that the fifth circuit device column C5 is positioned there-between. The second reference line Ref2 is provided at a predetermined interval from the sixth data line DL6 at the right side thereof under the circumstances that the sixth circuit device column C6 is positioned there-between.

The reference lines Ref1 and Ref2 are connected with the drain electrodes of the sensing thin film transistors T3 provided in each circuit device columns C1, C2, C3, C4, C5 and C6.

According to one embodiment of the present disclosure, the first reference line Ref1 is connected with the drain electrodes of the sensing thin film transistors T3 provided in each of the three circuit device columns C1, C2 and C3.

Thus, a second connection line CL2 is formed to connect the first reference line Ref1 to the drain electrodes in each sensing thin film transistors T3. The second connection line CL2 extends to the first circuit device column C1 at the left-side direction with respect to the first reference line Ref1 via the second circuit device column C2, and also extends to the third circuit device column C3 at the right-side direction. Thus, the second connection line CL2 is connected to the first reference line Ref1, and is also connected to the drain electrodes of the sensing thin film transistors T3 provided in each circuit device columns C1, C2 and C3.

Similarly, the second reference line Ref2 is connected to the drain electrodes of the sensing thin film transistors T3 provided in each of the three circuit device columns C4, C5 and C6. Thus, a third connection line CL3 is formed to connect the second reference line Ref2 to the drain electrodes in each sensing thin film transistors T3. The third connection line CL3 extends to the fourth circuit device column C4 at the left-side direction with respect to the second reference line Ref2 via the fifth circuit device column C5, and also extends to the sixth circuit device column C6 at the right-side direction. Thus, the third connection line (CL3) is connected to the second reference line Ref2, and is also connected to the drain electrodes of the sensing thin film transistors T3 provided in each circuit device columns C4, C5 and C6.

The switching thin film transistor T1, the driving thin film transistor T2, the sensing thin film transistor T3, and the capacitor C are provided in each circuit device columns C1, C,2 C3, C4, C5 and C6.

According as the switching thin film transistor T1 is switched in accordance with a gate signal supplied to the gate line GL, a data voltage provided from the data line D1, D2, D3, D4, D5 or D6 is supplied to the driving thin film transistor T2 by the use of switching thin film transistor.

According as the driving thin film transistor T2 is switched in accordance with the data voltage supplied from the switching thin film transistor T1, a data current is generated by the power supplied from the high level power line VDD, and then the generated data current is supplied to the organic light emitting device OLED.

The sensing thin film transistor T3 senses a threshold voltage deviation of the driving thin film transistor T2, which causes a deterioration of picture quality. The threshold voltage deviation may be sensed for a sensing mode. The sensing thin film transistor T3 supplies a voltage of the driving thin film transistor T2 to the reference line Ref1 or Ref2 in response to a sensing control signal supplied from the sensing control line SCL.

The capacitor C maintains the data voltage supplied to the driving thin film transistor T2 for one frame period. The capacitor C is connected with each of gate and source terminals of the driving thin film transistor T2.

The organic light emitting device OLED emits a predetermined amount of light in accordance with the data current supplied from the driving thin film transistor T2. The organic light emitting device OLED includes an anode, a cathode, and an emitting layer provided between the anode and the cathode. The anode of the organic light emitting device OLED is connected to the source terminal of the driving thin film transistor T2, and the cathode of the organic light emitting device OLED is connected to the low level power line VSS.

In the drawings, for convenience of explanation, the organic light emitting device OLED is shown in each circuit device column C1, C2, C3, C4, C5 and C6. However, some of the organic light emitting devices OLED may be overlapped with the high level power line VDD or the low level power line VSS. Also, some of the organic light emitting devices OLED may be overlapped with the neighboring plural circuit device columns C1, C2, C3, C4, C5 and C6 at the same time. This will be readily understood with reference to FIGS. 6 and 7 to be explained later.

A structure of the first circuit device column C1 may be identical to a structure of the fourth circuit device column C4. That is, an arrangement structure of the thin film transistors T1, T2 and T3 and the capacitor C included in the first circuit device column C1 may be identical to an arrangement structure of the thin film transistors T1, T2 and T3 and the capacitor C included in the fourth circuit device column C4. Also, a structure of the second circuit device column C2 may identical to a structure of the fifth circuit device column C5. Also, a structure of the third circuit device column C3 may be identical to a structure of the sixth circuit device column C6.

According to one embodiment of the present disclosure, the structure shown in FIG. 5 may be one unit, and the structure shown in FIG. 5 may be repetitively provided on the substrate. That is, the total six circuit device columns C1, C2, C3, C4, C5 and C6 may be formed by the use of one high level power line VDD and one low level power line VSS. In this case, a width Wvdd of the high level power line VDD and a width Wvss of the low level power line VSS may be the same as or more than a width of a red emission area having a relatively small size, but not limited to this structure. It is possible to form the circuit device columns more than six or less than six by the use of one high level power line VDD and one low level power line VSS.

As described above, considering that the structure of the first circuit device column C1 is identical to the structure of the fourth circuit device column C4, the width Wvdd of the high level power line VDD adjacent to the left side of the first circuit device column C1 is identical to the width Wvss of the low level power line VSS adjacent to the left side of the fourth circuit device column C4, preferably. When the width Wvdd of the high level power line VDD is different from the width Wvss of the low level power line VSS, a capacitance between the high level power line VDD and the circuit device inside the first circuit device column C1 is different from a capacitance between the low level power line VSS and the circuit device inside the fourth circuit device column C4, whereby the property of the circuit device inside the first circuit device column C1 and the property of the circuit device inside the fourth circuit device column C4 may be not uniform.

As shown in FIG. 6, according to one embodiment of the present disclosure, a first emission area E1 for emitting red (R) light, a second emission area E2 for emitting green (G) light, and a third emission area E3 for emitting blue (B) light are prepared on the circuit structure of FIG. 5.

The first emission area E1 is overlapped with the high level power line VDD and the low level power line VSS at different, respective locations. A width W1 of the first emission area E1 is formed to be identical to or to be less than the width Wvdd of the high level power line VDD and the width Wvss of the low level power line VSS. (In some instances, the width Wvss of the VSS line might be slightly larger than the width Wvdd of the VDD line, but this is acceptable. Even in those instances the width of the particular power supply line, whether VSS or VDD will be equal to or wider than the width of the particular emission area with which it overlaps.

The second emission area E2 is prepared next to the first emission area E1. A width W2 of the second emission area E2 is larger than the width W1 of the first emission area E1. The second emission area E2 is overlapped with the first circuit device column C1, and is partially overlapped with the second circuit device column C2. Especially, the second emission area E2 is overlapped with the thin film transistors T1, T2 and T3 provided in the first circuit device column C1, and may be overlapped with the first data line DL1 and the second data line DL2 provided between the first circuit device column C1 and the second circuit device column C2. In some cases, the second emission area E2 may be overlapped with some of the thin film transistors T1, T2 and T3 provided in the second circuit device column C2. Accordingly, the width W2 of the second emission area E2 is larger than a width of the first data line DL1 and a width of the second data line DL2.

Also, the second emission area E2 is overlapped with the fourth circuit device column C4, and may be partially overlapped with the fifth circuit device column C5. Especially, the second emission area E2 is overlapped with the thin film transistors T1, T2 and T3 provided in the fourth circuit device column C4, and may be overlapped with the fourth data line DL4 and the fifth data line DL5 provided between the fourth circuit device column C4 and the fifth circuit device column C5. In some cases, the second emission area E2 may be overlapped with some of the thin film transistors T1, T2 and T3 provided in the fifth circuit device column C5. Accordingly, the width W2 of the second emission area E2 is larger than a width of the fourth data line DL4 and a width of the fifth data line DL5.

The third emission area E3 is prepared next to the second emission area E2. A width W3 of the third emission area E3 may be larger than the width W2 of the second emission area E2. The third emission area E3 is partially overlapped with the second circuit device column C2, and may be overlapped with the third circuit device column C3. Especially, the third emission area E3 is overlapped with the thin film transistors T1, T2 and T3 provided in the third circuit device column C3, overlapped with the first reference line Ref1 provided between the second circuit device column C2 and the third circuit device column C3, and may be overlapped with some of the thin film transistors T1, T2 and T3 provided in the second circuit device column C2. Accordingly, the width W3 of the third emission area E3 is larger than a width of the first reference line Ref1. In this case, the width W3 of the third emission area E3 is larger than the width W2 of the second emission area E2, whereby an overlap area between the second circuit device column C2 and the third emission area E3 may be larger than an overlap area between the second circuit device column C2 and the second emission area E2. Meanwhile, the third emission area E3 may be overlapped with the third data line DL3.

Also, the third emission area E3 is partially overlapped with the fifth circuit device column C5, and may be overlapped with the sixth circuit device column C6. Especially, the third emission area E3 is overlapped with some of the thin film transistors (T1, T2 and T3 provided in the sixth circuit device column C6, overlapped with the second reference line Ref2 provided between the fifth circuit device column C5 and the sixth circuit device column C6, and may be overlapped with some of the thin film transistors T1, T2 and T3 provided in the fifth circuit device column C5. Accordingly, the width W3 of the third emission area E3 is larger than a width of the second reference line Ref2. In this case, the width W3 of the third emission area E3 is larger than the width W2 of the second emission area E2, whereby an overlap area between the fifth circuit device column C5, and the third emission area E3 may be larger than an overlap area between the fifth circuit device column C5 and the second emission area E2. Meanwhile, the third emission area E3 may be overlapped with the sixth data line DL6.

As shown in FIG. 7, according to another embodiment of the present disclosure, a first emission area E1 for emitting red (R) light, a second emission area E2 for emitting green (G) light, and a third emission area E3 for emitting blue (B) light are prepared on the circuit structure of FIG. 5.

In the same manner as the above FIG. 6, the first emission area E1 is overlapped with the high level power line VDD and the low level power line VSS. A width W1 of the first emission area E1 is formed to be identical to or to be less than the width Wvdd of the high level power line VDD and the width Wvss of the low level power line VSS.

The second emission area E2 is prepared next to the first emission area E1. A width W2 of the second emission area E2 is identical to the width W1 of the first emission area E1. The second emission area E2 may be overlapped with the first circuit device column C1. Thus, the second emission area E2 is overlapped with the thin film transistors T1, T2 and T3 provided in the first circuit device column C1. In some cases, the second emission area E2 may be overlapped with at least one of the first data line DL1 and the second data line DL2 provided between the first circuit device column C1 and the second circuit device column C2.

Also, the second emission area E2 may be overlapped with the fourth circuit device column C4. Thus, the second emission area E2 is overlapped with the thin film transistors T1, T2 and T3 provided in the fourth circuit device column C4. In some cases, the second emission area E2 may be overlapped with at least one of the fourth data line DL4 and the fifth data line DL5 provided between the fourth circuit device column C4 and the fifth circuit device column C5.

The third emission area E3 is prepared next to the second emission area E2. A width W3 of the third emission area E3 is larger than the width W1 of the first emission area E1 and the width W2 of the second emission area E2. The third emission area E3 may be overlapped with the second circuit device column C2 and the third circuit device column C3. Thus, the third emission area E3 is overlapped with the thin film transistors T1, T2 and T3 provided in the second circuit device column C2, overlapped with the first reference line Ref1 provided between the second circuit device column C2 and the third circuit device column C3, and may be overlapped with the thin film transistors T1, T2 and T3 provided in the third circuit device column C3. In some cases, the third emission area E3 may be overlapped with at least one of the first data line DL1 and the second data line DL2 provided between the first circuit device column C1 and the second circuit device column C2. Also, the third emission area E3 may be overlapped with the third data line DL3.

Also, the third emission area E3 may be overlapped with the fifth circuit device column C5 and the sixth circuit device column C6. Thus, the third emission area E3 is overlapped with the thin film transistors T1, T2 and T3 provided in the fifth circuit device column C5, overlapped with the second reference line Ref2 provided between the fifth circuit device column C5 and the sixth circuit device column C6, and may be overlapped with the thin film transistors T1, T2 and T3 provided in the sixth circuit device column C6. In some cases, the third emission area E3 may be overlapped at least one of the fourth data line DL4 and the fifth data line DL5 provided between the fourth circuit device column C4 and the fifth circuit device column C5. Also, the third emission area E3 may be overlapped with the sixth data line DL6.

Figure 8:
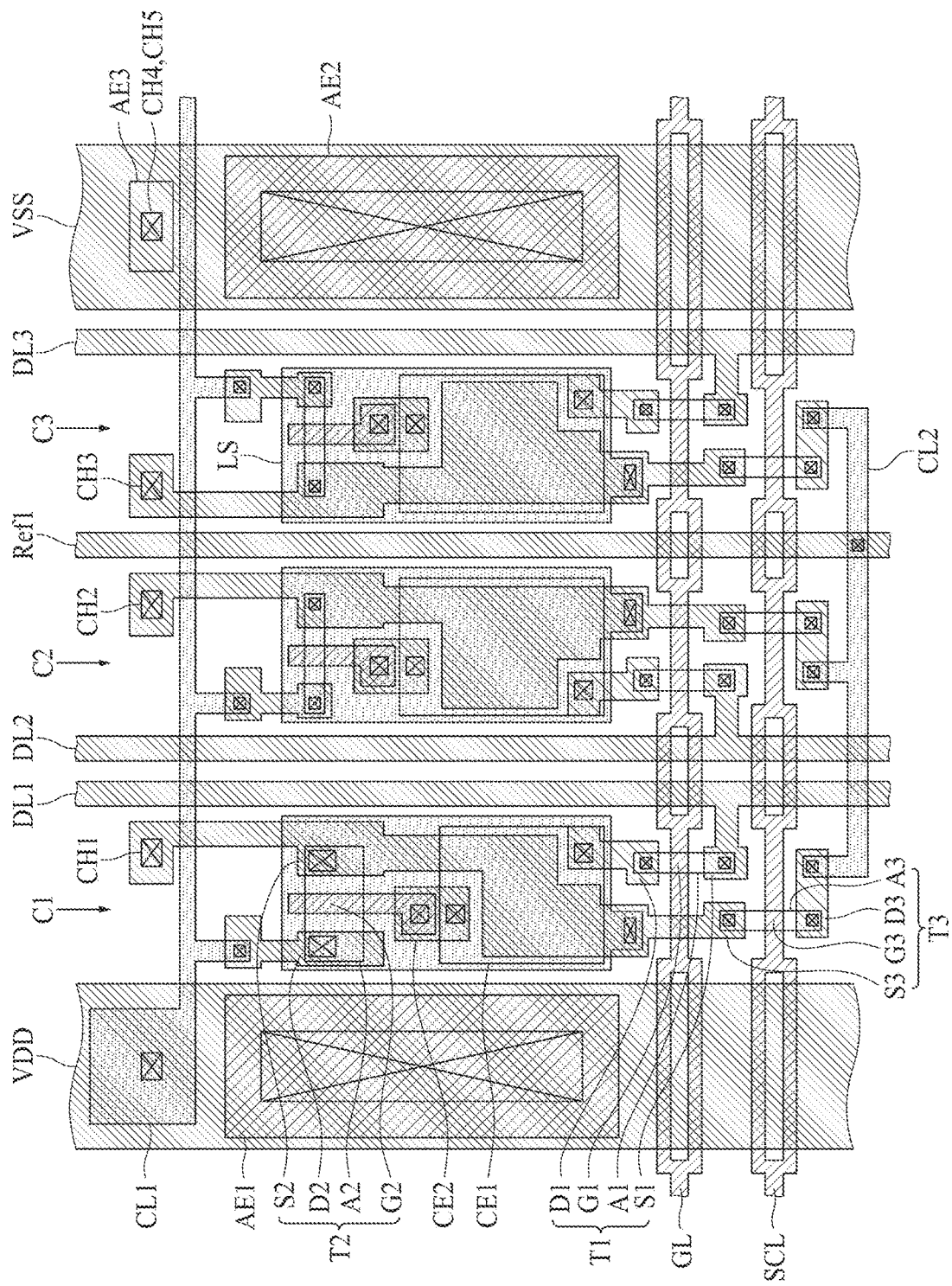
FIG. 8 is a plan view illustrating an electroluminescent display device according to one embodiment of the present disclosure, which has a circuit structure of FIG. 5.

FIG. 8 is a plan view illustrating an electroluminescent display device according to one embodiment of the present disclosure, which has a circuit structure of FIG. 5. In FIG. 8, a structure of fourth to sixth circuit device columns C4, C5 and C6 shown in FIG. 5 will be omitted.

As shown in FIG. 8, a gate line GL and a sensing control line SCL are arranged in a horizontal direction, and a high level power line VDD, a low level power line VSS, data lines DL1, DL2 and DL3, and a first reference line Ref1 are arranged in a vertical direction.

The gate line GL and the sensing control line SCL are positioned in the same layer, and are formed of the same material. The high level power line VDD, the low level power line VSS, the data lines DL1, DL2 and DL3, and the first reference line Ref1 are positioned in the same layer, and are formed of the same material. A detailed structure of each line is the same as that of FIG. 5, whereby a detailed description for the same parts will be omitted.

A first circuit device column C1 is prepared between the high level power line VDD and the first data line DL1. In the first circuit device column C1, there are a switching thin film transistor T1, a driving thin film transistor T2, and a sensing thin film transistor T3.

The switching thin film transistor T1 provided in the first circuit device column C1 may include a first gate electrode G1, a first source electrode S1, a first drain electrode D1, and a first active layer A1.

The first gate electrode G1 may be formed of one portion of the gate line GL, but not limited to this structure. For example, the first gate electrode G1 may be formed in a structure separated from the gate line GL.

The first source electrode S1 may be formed in a structure separated from the first data line DL1.

The first drain electrode D1 and the first source electrode S1 confronting each other are formed in the same layer. The first drain electrode D1 is connected to a second gate electrode G2 of the driving thin film transistor T2 via the connection electrodes CE1 and CE2.

The connection electrode CE1 and CE2 may include the first connection electrode CE1 and the second connection electrode CE2. The first connection electrode CE1 is connected to the first drain electrode D1 via one contact hole, and is connected to the second connection electrode CE2 via the other contact hole. The first connection electrode CE1 has a relatively large size so that it is possible to improve a capacitance of the capacitor C. The second connection electrode CE2 is connected with each of the first connection electrode CE1 and the second gate electrode G2 of the driving thin film transistor T2 via the individual contact holes. The first connection electrode CE1 is formed at the same layer as the first active layer A1, and the second connection electrode CE2 is formed at the same layer as the first source electrode S1 and the first drain electrode D1.

The first active layer A1 is connected with each of the first source electrode S1 and the first drain electrode D1 via the individual contact holes, whereby the first active layer A1 functions as an electron shift channel.

The driving thin film transistor T2 provided in the first circuit device column C1 may include a second gate electrode G2, a second source electrode S2, a second drain electrode D2, and a second active layer A2.

As described above, the second gate electrode G2 may be connected to the first drain electrode D1 of the switching thin film transistor T1 via the connection electrodes CE1 and CE2. The second gate electrode G2 and the first gate electrode G1 may be formed at the same layer.

The second source electrode S2 confronts with the second drain electrode D2, and the second source electrode S2 extends along the vertical direction. The second source electrode S2 has a relatively large size so that it is possible to ensure enough capacitance of the capacitor C. An upper portion of the second source electrode S2 is connected to an anode of an organic light emitting device in a first pixel via a first contact hole CH1. A lower portion of the second source electrode S2 is connected to a third source electrode S3 of the sensing thin film transistor T3. The second source electrode S2 and the third source electrode S3 may be formed as one body.

The second drain electrode D2 is connected with the high level power line VDD via a first connection line CL1. The first connection line CL1 is connected to each of the high level power line VDD and the second drain electrode D2 via individual contact holes. The first connection line CL1 may be formed in the lowermost layer of a substrate, that is, may be formed right on an upper surface of the substrate. The second source electrode S2 and the second drain electrode D2 may be positioned at the same layer as the first source electrode S1 and the first drain electrode D1, and may be formed of the same material as those of the first source electrode S1 and the first drain electrode D1.

The second active layer A2 is connected to each of the second source electrode S2 and the second drain electrode D2 via the individual contact holes, whereby the second active layer A2 functions as an electron shift channel. The second active layer A2 and the first active layer A1 are positioned at the same layer, and are formed of the same material.

The sensing thin film transistor T3 provided in the first circuit device column C1 may include a third gate electrode G3, a third source electrode S3, a third drain electrode D3, and a third active layer A3.

The third gate electrode G3 may be formed of one portion of the sensing control line SCL, but not limited to this structure. For example, the third gate electrode G3 may be formed in a structure separated from the sensing control line SCL.

As described above, the third source electrode S3 may be formed as one body with the second source electrode S2 of the driving thin film transistor T2.

The third drain electrode D3 and the third source electrode S3 confronting each other may be formed in the same layer. The third drain electrode D3 is connected with the first reference line Ref1 via a second connection line CL2. The second connection line CL2 is connected with each of the third drain electrode D3 and the first reference line Ref1 via the individual contact holes. The second connection line CL2 may be positioned in the same layer as the first connection line CL1, and may be formed of the same material as that of the first connection line CL1.

The third active layer A3 is connected with each of the third source electrode S3 and the third drain electrode D3 via the individual contact holes, whereby the third active layer A3 functions as an electron shift channel. The third active layer A3 may be positioned at the same layer as the first active layer A1, and may be formed of the same material as that of the first active layer A1.

Also, a light shielding layer LS is formed in the first circuit device column C1. The light shielding layer LS prevents light from being incident into the second active layer A2 of the driving thin film transistor T2. Accordingly, the light shielding layer LS has a relatively large area in comparison to the second active layer A2, and the light-shielding layer LS is overlapped with the second active layer A2. The light shielding layer LS extends to an area below the second source electrode S2, and the light shielding layer (LS) is overlapped with the connection electrodes CE1 and CE2, to thereby ensure an enough capacitance of the capacitor C. In this case, the light shielding layer LS is formed of a conductive material, and may be connected to the second source electrode S2 via the contact hole. The light shielding layer LS may be positioned at the same layer as the first connection line CL1 and the second connection layer CL2, and may be formed of the same material as those of the first connection line CL1 and the second connection line CL2.

A second circuit device column C2 is prepared between the second data line DL2 and the first reference line Ref1. In the second circuit device column C2, there are a switching thin film transistor T1, a driving thin film transistor T2, and a sensing thin film transistor T3.

Except that a first source electrode S1 is diverged from the second data line DL2, the switching thin film transistor T1 provided in the second circuit device column C2 is identical, in electrical connection structure, to the switching thin film transistor T1 provided in the first circuit device column C1.

Except that a second source electrode S2 is connected with an anode of an organic light emitting device in a second pixel via a second contact hole CH2, the driving thin film transistor T2 provided in the second circuit device column C2 is identical, in electrical connection structure, to the driving thin film transistor T2 provided in the first circuit device column C1.

The sensing thin film transistor T3 provided in the second circuit device column C2 is identical in electrical connection structure to the sensing thin film transistor T3 provided in the first circuit device column C1.

Also, a light shielding layer LS, which is identical to that of the first circuit device column C1, is formed in the second circuit device column C2.

A third circuit device column C3 is prepared between the first reference line Ref1 and the third data line DL3. In the third circuit device column C3, there are a switching thin film transistor T1, a driving thin film transistor T2, and a sensing thin film transistor T3).

Except that a first source electrode S1 is diverged from the third data line DL3, the switching thin film transistor T1 provided in the third circuit device column C3 is identical, in electrical connection structure, to the switching thin film transistor T1 provided in the first circuit device column C1.

Except that a second source electrode S2 is connected to an anode of an organic light emitting device in a third pixel via a third contact hole CH3, the driving thin film transistor T2 provided in the third circuit device column C3 is identical, in electrical connection structure, to the driving thin film transistor T2 provided in the first circuit device column C1.

The sensing thin film transistor T3 provided in the third circuit device column C3 is identical, in electrical connection structure, to the sensing thin film transistor T3 provided in the first circuit device column C1.

Also, a light shielding layer LS, which is identical to that of the first circuit device column C1, is formed in the third circuit device column C3.

Meanwhile, the high level power line VDD and the low level power line VSS may be respectively overlapped with auxiliary electrodes AE1 and AE2. The first auxiliary electrode AE1 is connected to the high level power line VDD via the contact hole, and the second auxiliary electrode AE2 is connected to the low level power line VSS via the contact hole. The first auxiliary electrode AE1 extends along a length direction of the high level power line VDD below the high level power line VDD, and the first auxiliary electrode AE1 may be overlapped with the high level power line VDD. The second auxiliary electrode AE2 extends along a length direction of the low level power line VSS below the low level power line VSS, and the second auxiliary electrode AE2 may be overlapped with the low level power line VSS. The first auxiliary electrode AE1 and the second auxiliary electrode AE2 may be positioned at the same layer as the first connection line CL1, the second connection line CL2 and the light shielding layer LS, and may be formed of the same material as the first connection line CL1, the second connection line CL2 and the light shielding layer LS. In order to prevent an electrical short, each of the first auxiliary electrode AE1 and the second auxiliary electrode AE2 is provided at a predetermined interval from the first connection line CL1.

Also, the low level power line VSS may be additionally overlapped with a third auxiliary electrode AE3. The third auxiliary electrode AE3 is formed between the low level power line VSS and a cathode of an organic light emitting device so that the low level power line VSS and the cathode of the organic light emitting device are connected to each other by the use of third auxiliary electrode AE3. The third auxiliary electrode AE3 is connected to the low level power line VSS via a fourth contact hole CH4, and is also connected to the cathode of the organic light emitting device via a fifth contact hole CH5. The third auxiliary electrode AE3 is positioned at the same layer as the anode of the organic light emitting device, and is formed of the same material as that of the anode of the organic light emitting device.

Figure 9:
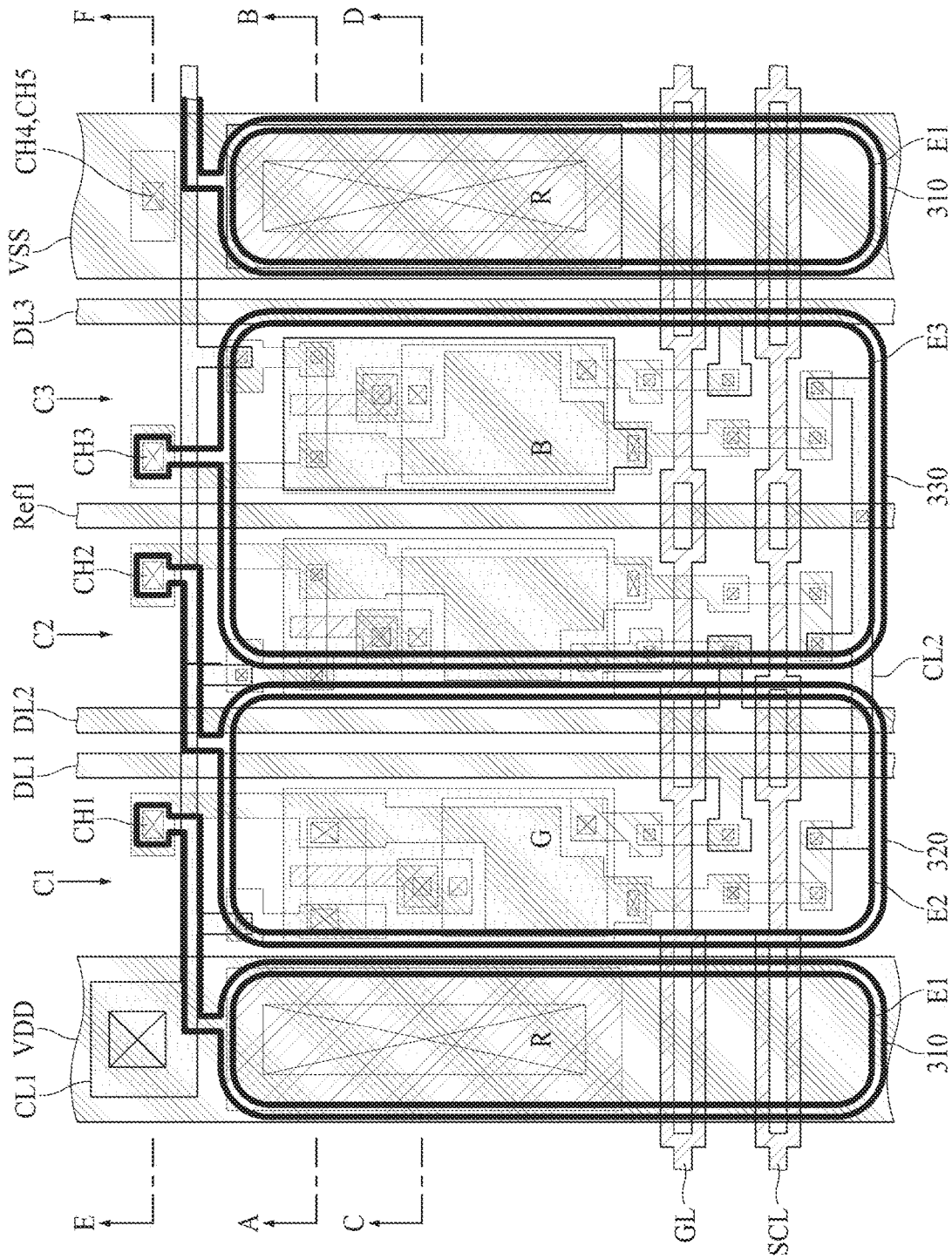
FIG. 9 is a plan view illustrating an electroluminescent display device according to one embodiment of the present disclosure, which shows a plurality of emission areas arranged in a circuit structure of FIG. 8.

FIG. 9 is a plan view illustrating an electroluminescent display device according to one embodiment of the present disclosure, which shows a plurality of emission areas arranged in a circuit structure of FIG. 8. FIG. 9 shows that a width of a second emission area E2 is larger than a width of a first emission area E1, and a width of a third emission area E3 is larger than the width of the second emission area E2, as shown in FIG. 6.

As shown in FIG. 9, the first emission area E1 is overlapped with a high level power line VDD. Also, the first emission area E1 is overlapped with a first electrode 310 which functions as an anode of an organic light emitting device. An area of the first electrode 310 is relatively larger than the first emission area E1. The first electrode 310 overlapped with the first emission area E1 extends to a first contact hole CH1, and is then connected with a second source electrode S2 of a driving thin film transistor T2 provided in a first circuit device column C1 via the first contact hole CH1.

Accordingly, each of the first emission area E1 and the first electrode 310 overlapped with the first emission area E1 is overlapped with the high level power line VDD, but not overlapped with the first circuit device column C1 prepared with a circuit device for controlling a light emission of the first emission area E1.

The second emission area E2 is overlapped with the first circuit device column C1, and first and second data lines DL1 and DL2, and may be partially overlapped with a second circuit device column C2. As described in FIG. 7, when the width of the second emission area E2 is identical to the width of the first emission area E1, the second emission area E2 may be not overlapped with the second circuit device column C2.

The second emission area E2 is overlapped with a first electrode 320 which functions as an anode of an organic light emitting device. An area of the first electrode 320 is relatively larger than the second emission area E2. The first electrode 320 overlapped with the second emission area E2 extends to a second contact hole CH2, and is then connected with a second source electrode S2 of a driving thin film transistor T2 provided in a second circuit device column C2 via a second contact hole CH2.

Each of the second emission area E2 and the first electrode 320 overlapped with the second emission area E2 is overlapped with the first circuit device column C1. In some cases, each of the second emission area E2 and the first electrode 320 overlapped with the second emission area E2 may be partially overlapped with the second circuit device column C2 prepared with a circuit device for controlling a light emission of the second emission area E2.

The third emission area E3 may be overlapped with the second circuit device column C2, a first reference line Ref1, and a third circuit device column C3. The third emission area E3 is overlapped with a first electrode 330 which functions as an anode of an organic light emitting device. An area of the first electrode 330 is relatively larger than the third emission area E3. The first electrode 330 overlapped with the third emission area E3 extends to a third contact hole CH3, and is then connected with a second source electrode S2 of a driving thin film transistor T2 provided in the third circuit device column C3 via the third contact hole CH3.

Each of the third emission area E3 and the first electrode 330 overlapped with the third emission area E3 may be overlapped with the third circuit device column C3 prepared with a circuit device for controlling a light emission of the third emission area E3.

Each emission areas E1, E2, E3 are controlled in its light emission by the circuit device provided in each circuit device columns C1, C2 and C3. At this time, in case of the third emission area E3, it is overlapped with the third circuit device column C3 for controlling the light emission. In case of the first emission area E1, it is not overlapped with the first circuit device column C1 for controlling the light emission. Also, in case of the second emission area E2, it may be overlapped with the second circuit device column C2 for controlling the light emission, or not.

Figure 10:
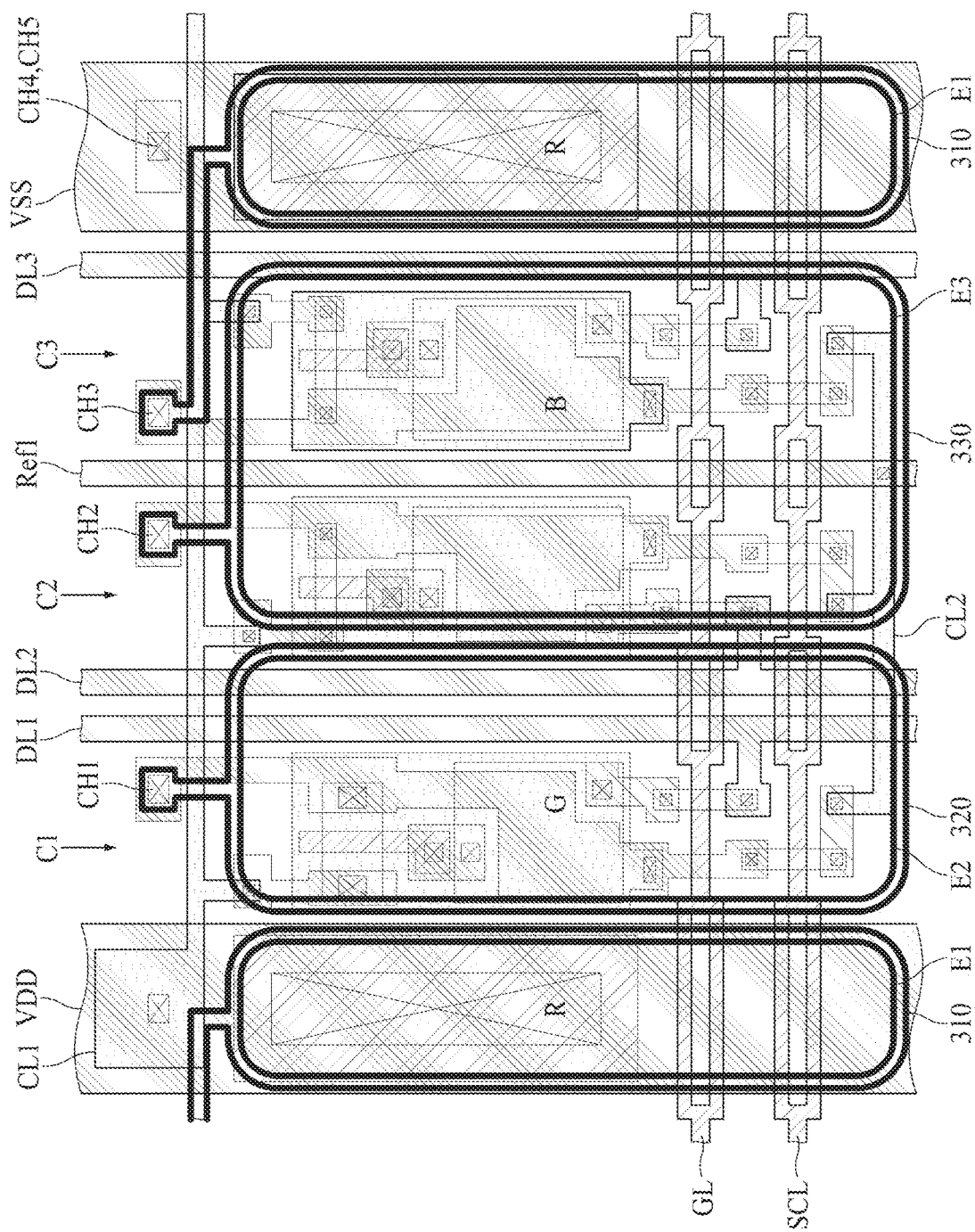
FIG. 10 is a plan view illustrating an electroluminescent display device according to another embodiment of the present disclosure, which shows a plurality of emission areas arranged in a circuit structure of FIG. 8.

FIG. 10 is a plan view illustrating an electroluminescent display device according to another embodiment of the present disclosure, which shows a plurality of emission areas arranged in a circuit structure of FIG. 8. Except a structure of a circuit device columns C1, C2 and C3 connected to the first electrodes 310, 320 and 330, the structure of FIG. 10 is identical to the structure of FIG. 9, whereby only the different structures will be described in detail as follows.

As shown in FIG. 10, the first electrode 310 overlapped with a first emission area E1 extends to a third contact hole CH3, and is then connected with a second source electrode S2 of a driving thin film transistor T2 provided in a third circuit device column C3 via the third contact hole CH3.

Accordingly, each of the first emission area E1 and the first electrode 310 overlapped with the first emission area E1 is overlapped with a low level power line VSS, and is not overlapped with the third circuit device column C3 prepared with a circuit device for controlling a light emission of the first emission area E1.

The first electrode 320 overlapped with the second emission area E2 extends to a first contact hole CH1, and is connected with a second source electrode S2 of a driving thin film transistor T2 provided in a first circuit device column C1 via the first contact hole CH1.

Accordingly, the second emission area E2 and the first electrode 320 overlapped with the second emission area E2 may be overlapped with the first circuit device column C1 prepared with a circuit device for controlling a light emission of the second emission area E2.

The first electrode 330 overlapped with a third emission area E3 extends to a second contact hole CH2, and is then connected with a second source electrode S2 of a driving thin film transistor T2 provided in a second circuit device column C2 via the second contact hole CH2.

Accordingly, each of the third emission area E3 and the first electrode 330 overlapped with the third emission area E3 is overlapped with the second circuit device column C2 prepared with a circuit device for controlling a light emission of the third emission area E3, and also overlapped with the third circuit device column C3 prepared with a circuit device for controlling a light emission of the first emission area E1.

Thus, as shown in FIG. 10, the second emission area E2 and the third emission area E3 are respectively overlapped with the first circuit device column C1 and the second circuit device column C2 for controlling the light emission. However, the first emission area E1 is not overlapped with the third circuit device column C3 for controlling the light emission.

Hereinafter, a cross sectional structure of an electroluminescent display device according to the present disclosure will be described in detail as follows.

Figure 11:
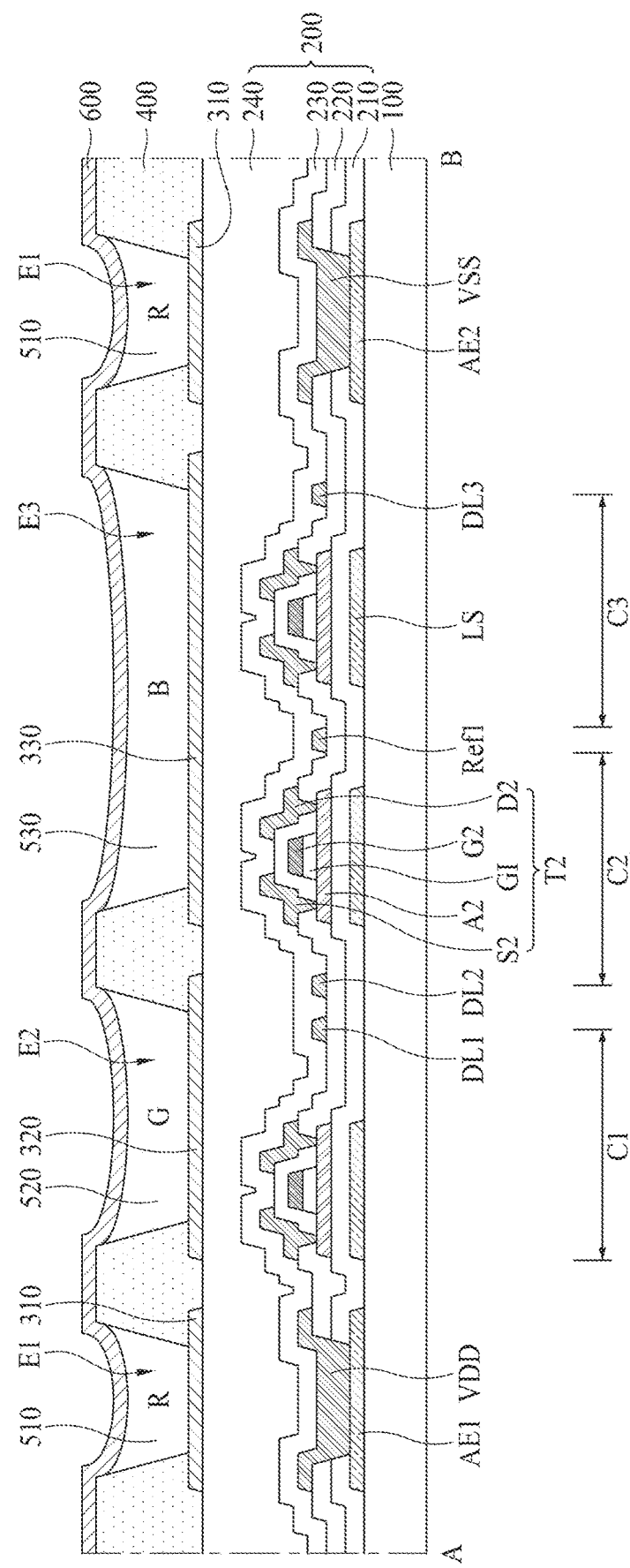
FIG. 11 is a cross sectional view along A-B of FIGS. 9 and 10.

FIG. 11 is a cross sectional view along A-B of FIG. 9. That is, FIG. 11 corresponds to a cross section of an area where a driving thin film transistor T2 for each individual circuit device columns C1, C2 and C3 is formed.

As shown in FIG. 11, a circuit device layer 200, first electrodes 310, 320 and 330, a bank 400, emission layers 510, 520 and 530, and a second electrode 600 are formed on a substrate 100.

The circuit device layer 200 includes auxiliary electrodes AE1 and AE2, a light shielding layer LS, a high level power line VDD, a low level power line VSS, a driving thin film transistor T2, data lines DL1, DL2 and DL3, a first reference line Ref1, a buffer layer 210, an insulating interlayer 220, a passivation layer 230, and a planarization layer 240.

The auxiliary electrodes AE1 and AE2 may include first and second auxiliary electrodes AE1 and AE2 formed on the substrate 100. The first auxiliary AE1 is provided below the high level power line VDD, and the second auxiliary electrode AE2 is provided below the low level power line VSS.

The light shielding layer LS is formed in each of first to third circuit device columns C1, C2 and C3 on the substrate 100. The light shielding layer LS may be positioned at the same layer as the auxiliary electrodes AE1 and AE2, and may be formed of the same material as that of the auxiliary electrodes AE1 and AE2.

The high level power line VDD is provided on the first auxiliary electrode AE1. In more detail, the buffer layer 210 and the insulating interlayer 220 are sequentially formed on the first auxiliary electrode AE1, and the high level power line VDD is formed on the insulating interlayer 220. The high level power line VDD is connected to the first auxiliary electrode AE1 via a contact hole provided at the buffer layer 210 and the insulating interlayer 220.

The low level power line VSS is provided on the second auxiliary electrode AE2. In more detail, the buffer layer 210 and the insulating interlayer 220 are sequentially formed on the second auxiliary electrode AE2, and the low level power line VSS is formed on the insulating interlayer 220. The low level power line VSS is connected with the second auxiliary electrode AE2 via a contact hole provided in the buffer layer 210 and the insulating interlayer 220.

The driving thin film transistor T2 is provided in each of the first to third circuit device columns C1, C2 and C3. The driving thin film transistor T2 may include a second active layer A2 provided on the buffer layer 210, a gate insulating layer GI provided on the second active layer A2, a second gate electrode (G2) provided on the gate insulating layer (GI), and second source and drain electrodes (S2, D2) provided on the insulating interlayer 220 and respectively connected with the second active layer (A2) via contact holes provided in the insulating interlayer 220. A width of the second active layer (A2) may be smaller than a width of the light shielding layer (LS).

The data line is provided on the insulating interlayer 220. The data line may include the first and second data lines DL1 and DL2 provided between the first circuit device column C1 and the second circuit device column C2. In addition, the data line may include the third data line DL3 provided between the third circuit device column C3 and the low level power line VSS.

The first reference line Ref1 is formed on the insulating interlayer 220. The first reference line Ref1 is provided between the second circuit device column C2 and the third circuit device column C3.

The high level power line VDD, the low level power line VSS, the second source electrode S2, the second drain electrode D2, the data lines DL1, DL2 and DL3, and the first reference line Ref1, which are provided on the insulating interlayer 220, may be formed of the same material.

The passivation layer 230 is formed on the high level power line VDD, the low level power line VSS, the second source electrode S2, the second drain electrode D2, the data line DL1, DL2 and DL3, and the first reference line Ref1.

The planarization layer 240 is formed on the passivation layer 230.

The first electrode 310, 320 and 330 is formed on the planarization layer 240. The first electrode 310, 320 and 330 is patterned by each area corresponding to the emission areas E1, E2 and E3.

The bank 400 is configured to cover both ends of the first electrodes 310, 320 and 330, and is provided on the planarization layer 240. The emission areas E1, E2 and E3 is defined by the bank 400. The position of the emission areas E1, E2 and E3, in other words, the overlap area between the emission areas E1, E2 and E3 and the circuit device columns C1, C2 and C3, and the overlap area between the emission areas E1, E2 and E3 and the power lines VDD and VSS may be the same as the above, whereby a detailed description for the position of the emission areas E1, E2 and E3 will be omitted.

The emission areas 510, 520 and 530 are individually formed on the first electrodes 310, 320 and 330. The emission layers 510, 520 and 530 may include the first emission layer 510 having a red (R) emission layer provided in the first emission area E1, the second emission layer 520 having a green (G) emission layer provided in the second emission area E2, and the third emission layer 530 having a blue (B) emission layer provided in the third emission area E3.

The second electrode 600 is formed on the emission layers 510, 520 and 530. The second electrode 600 is formed on the bank 400, whereby the second electrode 600 may be formed in the plurality of pixels, and also formed in the boundary area between each of the plurality of pixels.

Figure 12:
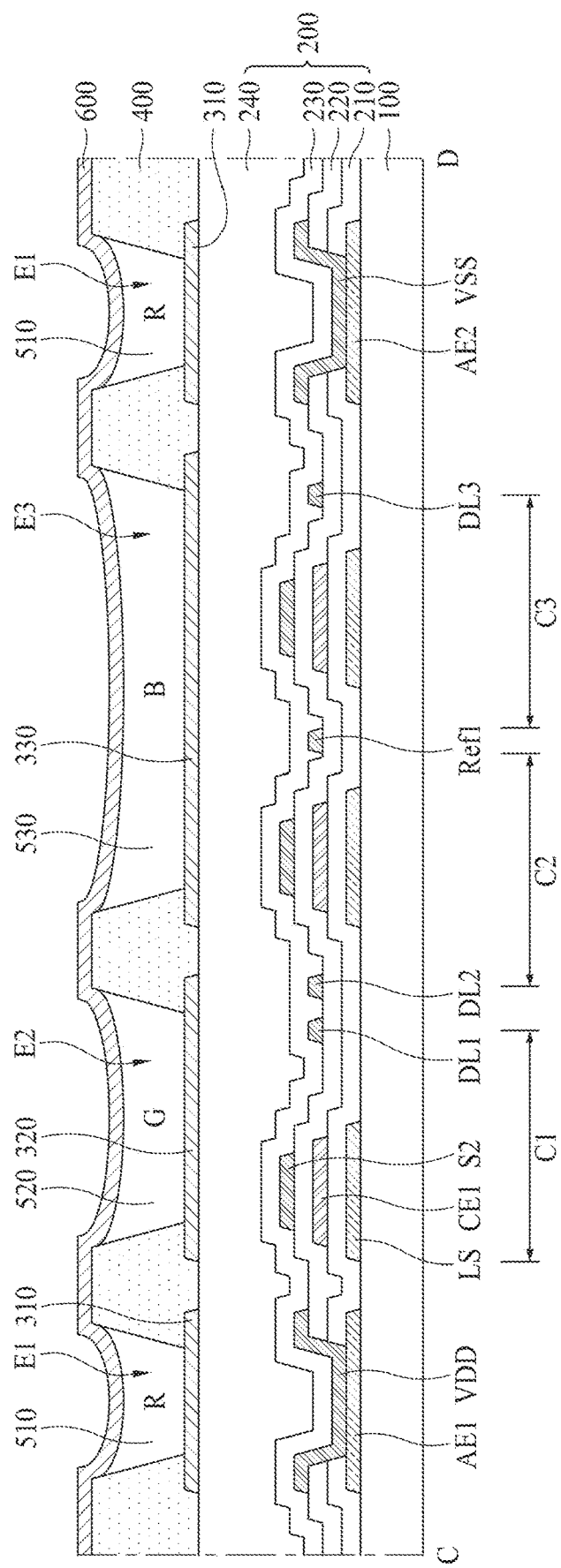
FIG. 12 is a cross sectional view along C-D of FIGS. 9 and 10.

FIG. 12 is a cross sectional view along C-D of FIG. 9. That is, FIG. 12 corresponds to a cross section of an overlap area between a first connection electrode CE1 and a second source electrode S2 provided in each individual circuit device columns C1, C2 and C3.

As shown in FIG. 12, a circuit device layer 200, first electrodes 310, 320 and 330, a bank 400, emission layers 510, 520 and 530, and a second electrode 600 are formed on a substrate 100.

The circuit device layer 200 includes auxiliary electrodes AE1 and AE2, a light shielding layer LS, a high level power line VDD, a low level power line VSS, a first connection electrode CE1, a second source electrode S2, data lines DL1, DL2 and DL3, a first reference line Ref1, a buffer layer 210, an insulating interlayer 220, a passivation layer 230, and a planarization layer 240.

The auxiliary electrodes AE1 and AE2, the light shielding layer LS, the high level power line VDD, the low level power line VSS, the data lines DL1, DL2 and DL3, the first reference line Ref1, the buffer layer 210, the insulating interlayer 220, the passivation layer 230, and the planarization layer 240 are the same as those of FIG. 11, whereby a detailed description for the above elements will be omitted.

The first connection electrode CE1 and the second source electrode S2 are formed in each of first to third circuit device columns C1, C2 and C3. The first connection electrode CE1 is formed between the buffer layer 210 and the insulating interlayer 220, and the second source electrode S2 is formed between the insulating interlayer 220 and the passivation layer 230. Thus, the first connection electrode CE1 is provided at a predetermined interval from the light shielding layer LS under the circumstances that the buffer layer 210 is provided in-between, and is also provided at a predetermined interval from the second source electrode S2 under the circumstances that the insulating interlayer 220 is provided in-between. The first connection electrode CE1, the light shielding layer LS, and the second source electrode S2 are overlapped with one another, to thereby form a capacitance. The first connection electrode CE1 is provided at the same layer as the active layers A1, A2 and A3. The active layers A1, A2 and A3 may be formed of oxide semiconductor, and the first connection electrode CE1 may be formed of a conductive material obtained by carrying out a conduction process for applying heat to the oxide semiconductor.

The first electrodes 310, 320 and 330, the bank 400, the emission layers 510, 520 and 530, and the second electrode 600 are the same as those of FIG. 11, whereby a detailed description for the above elements will be omitted.

Figure 13:
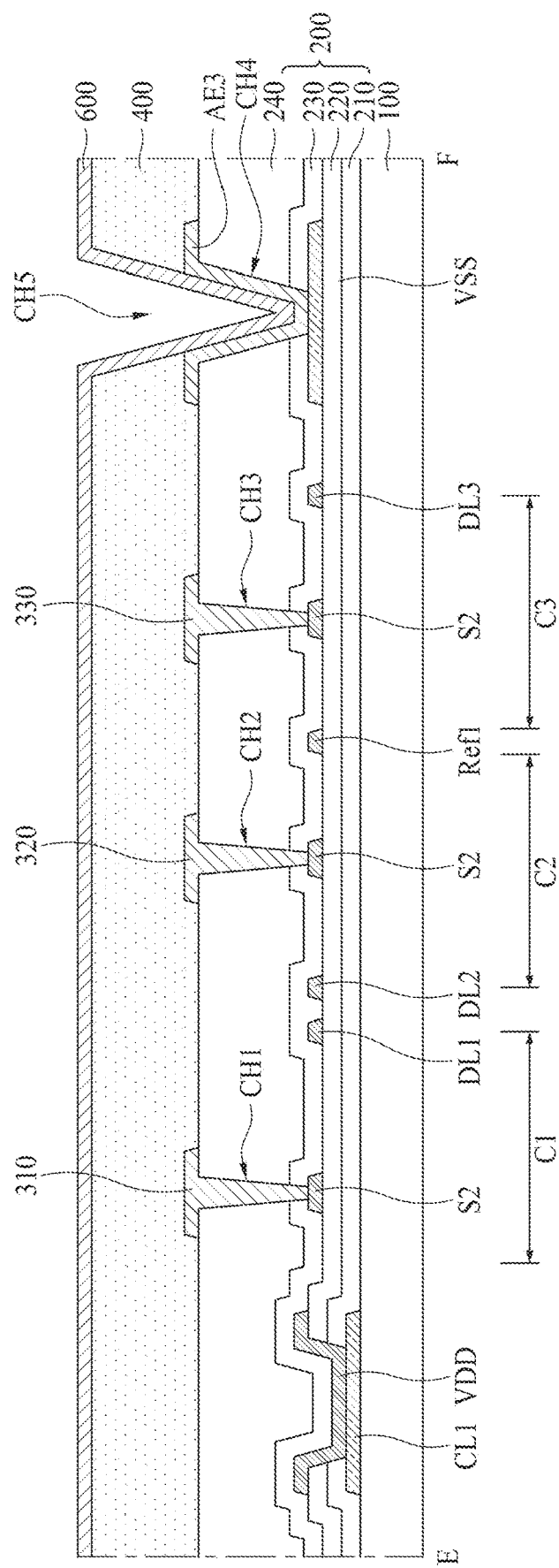
FIG. 13 is a cross sectional view along E-F of FIGS. 9 and 10.

FIG. 13 is a cross sectional view along E-F of FIG. 9. That is, FIG. 13 corresponds to a cross section of a contact holes CH1, CH2, CH3, CH4 and CH5 provided in each individual circuit device columns C1, C2 and C3.

As shown in FIG. 13, a circuit device layer 200, first electrodes 310, 320 and 330, a third auxiliary electrode AE3, a bank 400, and a second electrode 600 are formed on a substrate 100.

The circuit device layer 200 may include a first connection line CL1, a high level power line VDD, a low level power line VSS, a second source electrode S2, data lines DL1, DL2 and DL3, a first reference line Ref1, a buffer layer 210, an insulating interlayer 220, a passivation layer 230, and a planarization layer 240.

The first connection line CL1 is formed on the substrate 100. The first connection line CL1 is provided below the high level power line VDD. The first connection line CL1 is positioned in the same layer as the aforementioned first and second auxiliary electrodes AE1 and AE2 and the light shielding layer LS, and is formed of the same material as those of the first and second auxiliary electrodes AE1 and AE2, and the light shielding layer LS.

The high level power line VDD is provided above the first connection line CL1. In more detail, the buffer layer 210 and the insulating interlayer 220 are sequentially formed on the first connection line CL1, and the high level power line VDD is formed on the insulating interlayer 220. The high level power line VDD is connected with the first connection line CL1 via a contact hole provided in the buffer layer 210 and the insulating interlayer 220.

The low level power line VSS is formed on the insulating interlayer 220.

The second source electrode S2 is formed in each of first to third circuit device columns C1, C2 and C3. Especially, the second source electrode S2 is formed on the insulating interlayer 220.

The data lines DL1, D12 and DL3, the first reference line Ref1, the buffer layer 210, the insulating interlayer 220, the passivation layer 230, and the planarization layer 240 are the same as those of FIG. 11.

The first electrode 310, 320 and 330 is formed on the planarization layer 240. The first electrode 310 extending to an area corresponding to a first emission area E1 is connected to the second source electrode S2 provided at the first circuit device column C1 via a first contact hole CH1 provided at the passivation layer 230 and the planarization layer 240. The first electrode 320 extending to an area corresponding to a second emission area E2 is connected to the second source electrode S2 provided in the second circuit device column C2 via a second contact hole CH2 provided at the passivation layer 230 and the planarization layer 240. The first electrode 330 extending to an area corresponding to a third emission area E3 is connected to the second source electrode S2 provided at the third circuit device column C3 via a third contact hole CH3 provided at the passivation layer 230 and the planarization layer 240.

However, in case of the structure shown in FIG. 10, the first electrode 310 extending to the area corresponding to the first emission area E1 is connected to the second source electrode S2 provided in the third circuit device column C3 via the third contact hole CH3. The first electrode 320 extending to the area corresponding to the second emission area E2 is connected to the second source electrode S2 provided in the first circuit device column C3 via the first contact hole CH1. The first electrode 330 extending to the area corresponding to the third emission area E3 is connected to the second source electrode S2 provided in the second circuit device column C2 via the second contact hole CH2.

The third auxiliary electrode AE3 is formed on the planarization layer 240. The third auxiliary electrode AE3 is connected to the low level power line VSS via a fourth contact hole CH4 provided in the passivation layer 230 and the planarization layer 240. The third auxiliary electrode AE3 is formed of the same material as that of the first electrodes 310, 320 and 330.

The bank 400 is formed on the first electrodes 310, 320 and 330 and the third auxiliary electrode AE3. FIG. 13 corresponds to the boundary area between each of pixels, wherein the bank 400 is formed on the entire area of the substrate 100.

The second electrode 600 is formed on the bank 400. The second electrode 600 is connected with the third auxiliary electrode AE3 via a fifth contact hole CH5 formed in the bank 400. Thus, the second electrode 600 is connected with the low level power line VSS via the third auxiliary electrode AE3.

The above description shows that the first emission area E1 is overlapped with the power lines VDD and VSS, and the width W1 of the first emission area E1 is the same as or less than the widths Wvdd and Wvss of the power lines VDD and VSS, but not limited to this structure. For example, a width of another line instead of the power lines VDD and VSS is set to be the same as or more than the width W1 of the first emission area E1, and the first emission area E1 is overlapped with another signal line.

Figure 14:
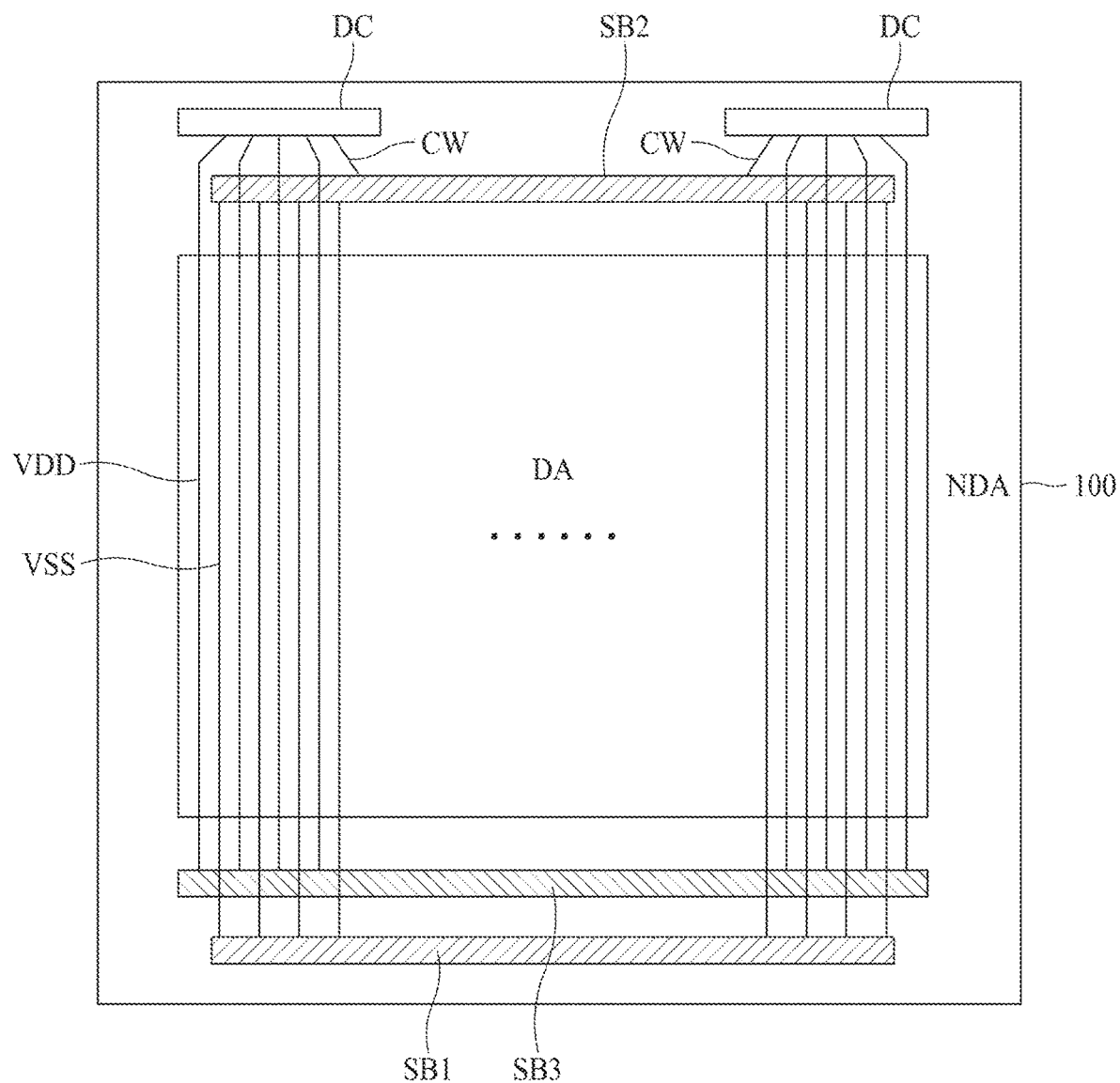
FIG. 14 is a plan view illustrating a high level power line and a low level power line arranged in a display area and a non-display area of an electroluminescent display device according to one embodiment of the present disclosure.

FIG. 14 is a plan view illustrating a high power line and a low power line arranged in a display area and a non-display area of an electroluminescent display device according to one embodiment of the present disclosure.

As shown in FIG. 14, a display area DA is prepared in the middle of a substrate 100, and a non-display area NDA is prepared in the periphery of the display area DA. The display area DA corresponds to the area for displaying an image by the use of light emission, and the non-display area NDA corresponds to the area in which a light emission is not generated, and thus, an image is not displayed. A pixel structure according to the aforementioned various embodiments of the present disclosure is formed in the display area DA.

A plurality of dummy pixels may be formed in the non-display area NDA. The plurality of dummy pixels may be provided to surround a plurality of pixels formed in the display area DA. The plurality of dummy pixels may include a dummy emission layer formed in each of a plurality of dummy emission areas prepared by a bank layer. Herein, according as an image is not displayed on the dummy pixel, a light emission is not generated in the dummy emission layer. The dummy emission layer is provided to realize uniformity of profile between an emission layer in the center of the display area DA and an emission layer in the edge of the display area DA.

When the emission layer in the display area DA is formed by a solution process, a drying speed of the emission layer in the center of the display area DA may be different from a drying speed of the emission layer in the edge of the display area DA, whereby a profile of the emission layer in the center of the display area DA and a profile of the emission layer in the edge of the display area DA may be not uniform. Thus, it is difficult to realize uniformity of light emission in the display area DA. In this reason, the dummy pixel is formed in the non-display area NDA, and the dummy emission layer is also formed in the non-display area NDA when the emission layer is formed in the display area DA. That is, even though the profile is not uniform in the dummy emission layer and the emission layer, it is possible to realize the uniform profile of the emission layer in the entire display area DA.

A plurality of the high level power lines VDD and a plurality of the low level power lines VSS are alternately arranged in a first direction, for example, a vertical direction in the display area DA. The plurality of the high level power lines VDD and the plurality of the low level power lines VSS extend to the non-display area NDA.

Respective lower ends of the plurality of the low level power lines VSS may be connected to each other by the use of first shorting bar SB1, and respective upper ends of the plurality of the low level power lines VSS may be connected to each other by the use of second shorting bar SB2, whereby the plurality of the low level power lines VSS may be electrically connected to each other. Each of the first shorting bar SB1 and the second shorting bar SB2 is formed in the non-display area NDA. The first shorting bar SB1 and the second shorting bar SB2 may be positioned in the same layer as the aforementioned first electrodes 310, 320 and 330, and may be formed of the same material as that of the aforementioned first electrodes 310, 320 and 330. The second shorting bar SB2 may be connected to a driving circuit portion DC provided at the non-display area NDA via a contact wire CW. Thus, the low level electric power applied through the driving circuit portion DC may be transmitted to the plurality of the low level power lines VSS via the contact wire CW and the second shorting bar SB2.

Respective lower ends of the plurality of the high level power lines VDD may be connected with each other by the use of third shorting bar SB3. Thus, the plurality of the high level power lines VDD may be electrically connected with each other. Also, respective upper ends of the plurality of the high level power lines VDD may be connected with the driving circuit portion DC. Thus, the high level electric power may be applied to the plurality of the high level power lines VDD via the driving circuit portion DC.

According to one embodiment of the present disclosure, the width of the power lines VDD and VSS is formed to be the same as or larger than the width of the first emission area, and the first emission area is overlapped with the power lines VDD and VSS so that it is possible to prevent the step difference in the first emission area caused by the power lines VDD and VSS. Accordingly, when the first emission layer is formed in the first emission area by the solution process, it is possible to realize the uniform profile of the first emission layer in the first emission area, to thereby realize the uniform light emission in the first emission area.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
a substrate;
a circuit device layer provided on the substrate;
a power line within the circuit device layer, the power line having a first width;
a first electrode on the circuit device layer, the first electrode having a first step difference adjacent to a first end of the first electrode and a second step difference adjacent to a second end of the first electrode;
a bank defining a first emission area and a second emission area on the circuit device layer, the first emission area having a second width and the second emission area having a third width; and
a first emission layer in the first emission area and a second emission layer in the second emission area,
wherein the first emission area is overlapped with the power line without overlapping the first step difference of the first electrode or the second step difference of the first electrode, the first width of the power line extends from a first end underlying a first portion of the bank at a first side of the first emission area to a second end underlying a second portion of the bank at a second side of the first emission area, and the second width is the same as or less than the first width.

2. The electroluminescent display device according to claim 1,
wherein the circuit device layer includes at least one of a data line or a reference line arranged in the same direction as the power line, and
the second emission area is overlapped with at least one of the data line or the reference line, and the third width is larger than at least one of a width of the data line or a width of the reference line.

3. The electroluminescent display device according to claim 2, wherein the third width is larger than the second width.

4. The electroluminescent display device according to claim 1, wherein a width of the first emission layer is the same as or less than the first width.

5. The electroluminescent display device according to claim 1, wherein the bank includes an organic insulating material.

6. The electroluminescent display device according to claim 1, wherein an upper portion of the bank includes a hydrophobic material.

7. The electroluminescent display device according to claim 1, wherein an upper portion the bank includes fluorine.

8. The electroluminescent display device according to claim 1, wherein a concentration of a hydrophobic material in a lower portion of the bank is lower than a concentration of the hydrophobic material in an upper portion of the bank.

9. The electroluminescent display device according to claim 1, wherein a first thickness at a center portion of the first emission area is less than a second thickness at a side portion of the first emission area.

10. The electroluminescent display device according to claim 1, further comprising a second electrode disposed on the bank and the first emission layer.

11. The electroluminescent display device according to claim 1, further comprising at least one of a lower insulating layer or an upper insulating layer.

12. The electroluminescent display device according to claim 11,
wherein the electroluminescent display device includes the lower insulating layer, and the lower insulating layer includes at least one of a buffer layer, a gate insulating layer, or an insulating interlayer.

13. The electroluminescent display device according to claim 11,
wherein the electroluminescent display device includes the upper insulating layer, and the upper insulating layer includes at least one of a passivation layer or a planarization layer.

14. The electroluminescent display device according to claim 11, wherein the first electrode is disposed on the upper insulating layer.

15. An electroluminescent display device, comprising:
a substrate;
a circuit device layer on the substrate;
a power line within the circuit device layer;
a first electrode on the circuit device layer, the first electrode having a first step difference adjacent to a first end of the first electrode and a second step difference adjacent to a second end of the first electrode;
a bank defining a first emission area and a second emission area on the circuit device layer; and
a first emission layer in the first emission area and a second emission layer in the second emission area,
wherein the power line has a width that extends completely across a width of the first emission area,
wherein the first electrode has a width that extends across the width of the first emission area and the width of the power line,
wherein the first emission area, the first electrode, and the power line are overlapped with each other, and
wherein the first emission area and the power line are disposed without overlapping the first step difference of the first electrode or the second step difference of the first electrode.

16. The electroluminescent display device according to claim 15,
wherein the circuit device layer includes at least one of a data line or a reference line arranged in a same direction as the power line, and
the second emission area is overlapped with at least one of the data line or the reference line, and the second emission area has a width that is larger than at least one of a width of the data line or a width of the reference line.

17. The electroluminescent display device according to claim 16, wherein the width of the second emission area is larger than the width of the first emission area.

18. The electroluminescent display device according to claim 15, wherein a thickness of the circuit device layer is substantially uniform across the width of the first emission area.

* * * * *